(12) United States Patent
Isogai

(10) Patent No.: US 12,609,149 B2
(45) Date of Patent: Apr. 21, 2026

(54) SEMICONDUCTOR CIRCUIT

(71) Applicant: SONY SEMICONDUCTOR SOLUTIONS CORPORATION, Kanagawa (JP)

(72) Inventor: Daishi Isogai, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 155 days.

(21) Appl. No.: 18/709,583

(22) PCT Filed: Sep. 27, 2022

(86) PCT No.: PCT/JP2022/035906
§ 371 (c)(1),
(2) Date: May 13, 2024

(87) PCT Pub. No.: WO2023/089959
PCT Pub. Date: May 25, 2023

(65) Prior Publication Data
US 2025/0006238 A1 Jan. 2, 2025

(30) Foreign Application Priority Data

Nov. 19, 2021 (JP) ................................. 2021-188663

(51) Int. Cl.
| | |
|---|---|
| *G11C 11/16* | (2006.01) |
| *G11C 5/06* | (2006.01) |
| *G11C 13/00* | (2006.01) |

(52) U.S. Cl.
CPC .......... *G11C 11/1673* (2013.01); *G11C 5/063* (2013.01); *G11C 11/1697* (2013.01); *G11C 13/0038* (2013.01); *G11C 13/004* (2013.01)

(58) Field of Classification Search
CPC . G11C 11/1673; G11C 11/1697; G11C 11/16; G11C 11/1659; G11C 11/1675;
(Continued)

(56) References Cited

U.S. PATENT DOCUMENTS

2023/0154557 A1* 5/2023 Chang .................... G11C 17/18
365/96

FOREIGN PATENT DOCUMENTS

| | | |
|---|---|---|
| JP | 2003-317467 A | 11/2003 |
| JP | 2006-210396 A | 8/2006 |

(Continued)

OTHER PUBLICATIONS

International Search Report and Written Opinion of PCT Application No. PCT/JP2022/035906, issued on Dec. 20, 2022, 09 pages of ISRWO.

*Primary Examiner* — Sultana Begum
(74) *Attorney, Agent, or Firm* — CHIP LAW GROUP

(57) ABSTRACT

A semiconductor circuit according to the present disclosure includes first and second memory cells, first and second signal lines, a sense amplifier, a first switch, and a second switch. The sense amplifier includes a latch circuit, a first transistor, a second transistor, and a third transistor. The latch circuit is configured to apply, to a second node, a voltage inverted with respect to a voltage at a first node and apply, to the first node, a voltage inverted with respect to a voltage at the second node. The first transistor includes a source, and includes a gate and a drain that are coupled to the first node. The second transistor includes a source, and includes a gate and a drain that are coupled to the second node. The third transistor includes a source, a gate to which a control voltage is applicable, and a drain coupled to the source of the first transistor, the source of the second transistor, or both. The first switch is configured to couple the first signal line and the first node to each other. The (Continued)

second switch is configured to couple the second signal line and the second node to each other.

17 Claims, 19 Drawing Sheets

(58) Field of Classification Search
CPC . G11C 11/1693; G11C 5/063; G11C 13/0038; G11C 13/004; G11C 13/0004; G11C 13/0069; G11C 7/065; G11C 7/06; G11C 7/14; G11C 17/16; G11C 17/18
See application file for complete search history.

(56) References Cited

FOREIGN PATENT DOCUMENTS

| | | | |
|----|----------------|----|---------|
| JP | 2011-204287 | A  | 10/2011 |
| JP | 2013-125565 | A  | 6/2013  |
| JP | 2013-251035 | A  | 12/2013 |
| JP | 2016-511502 | A  | 4/2016  |
| WO | 2006/064559 | A1 | 6/2006  |
| WO | 2015/083754 | A1 | 6/2015  |

* cited by examiner

[FIG. 1]
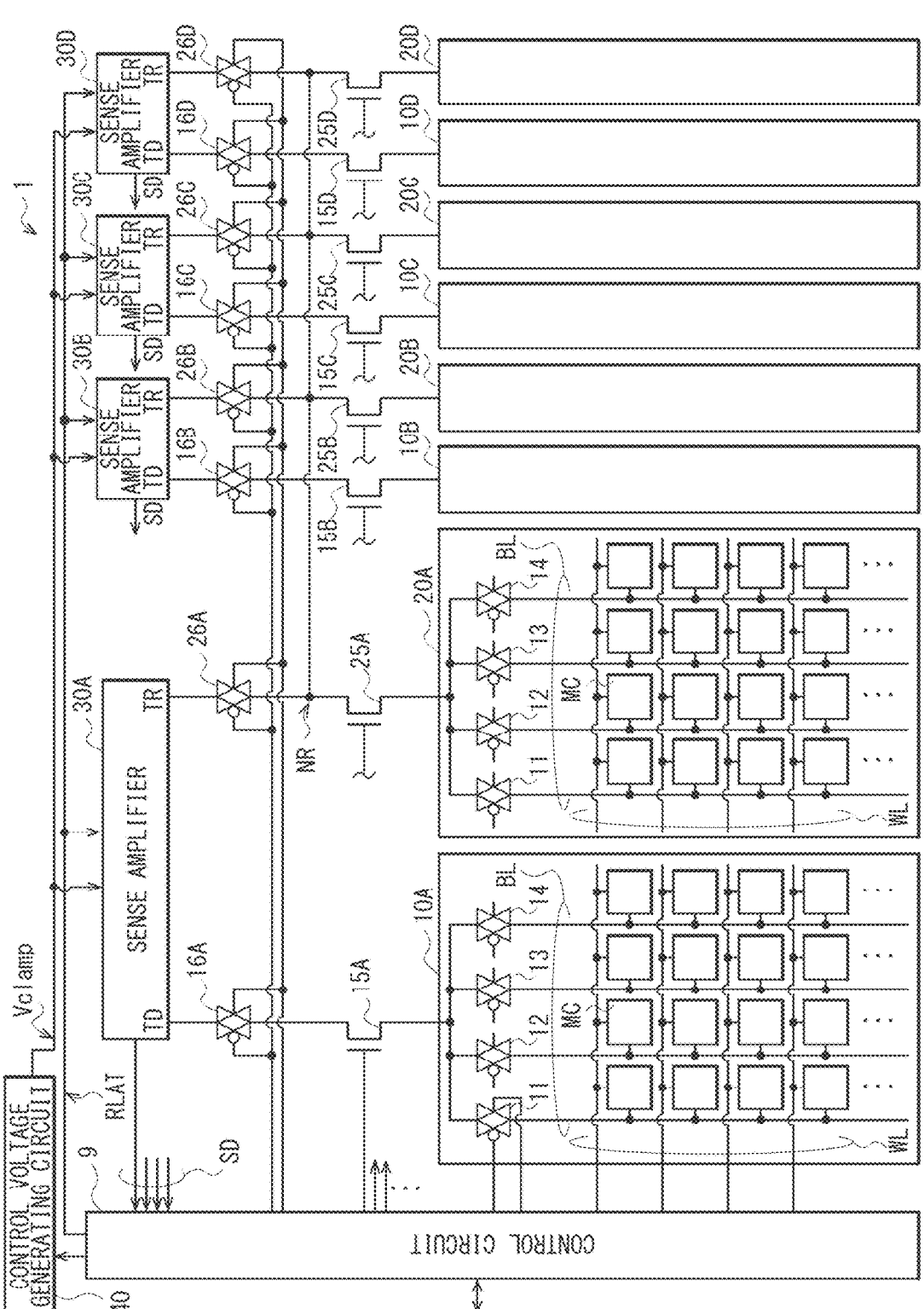

[FIG. 2]
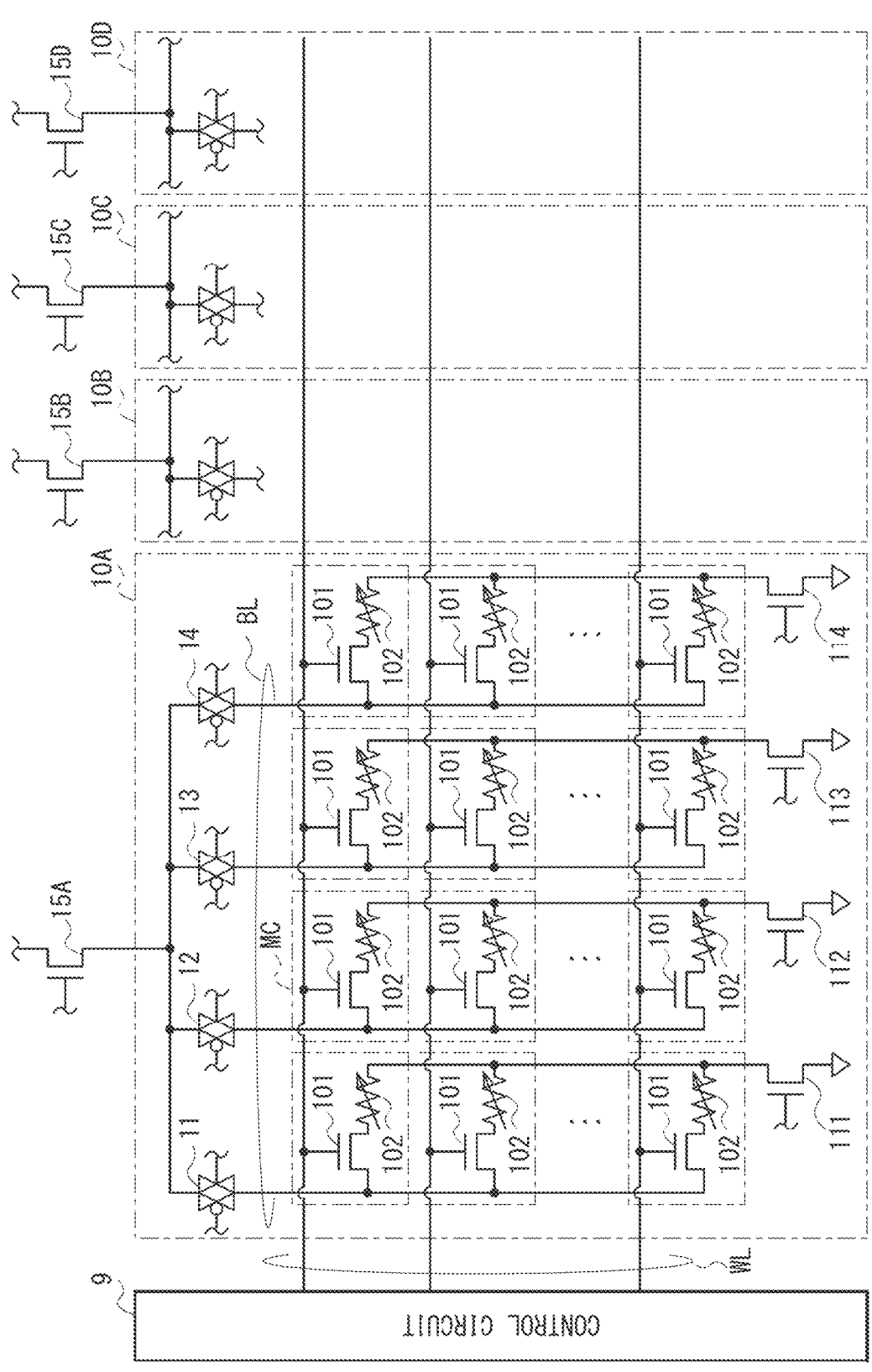

[FIG. 3]
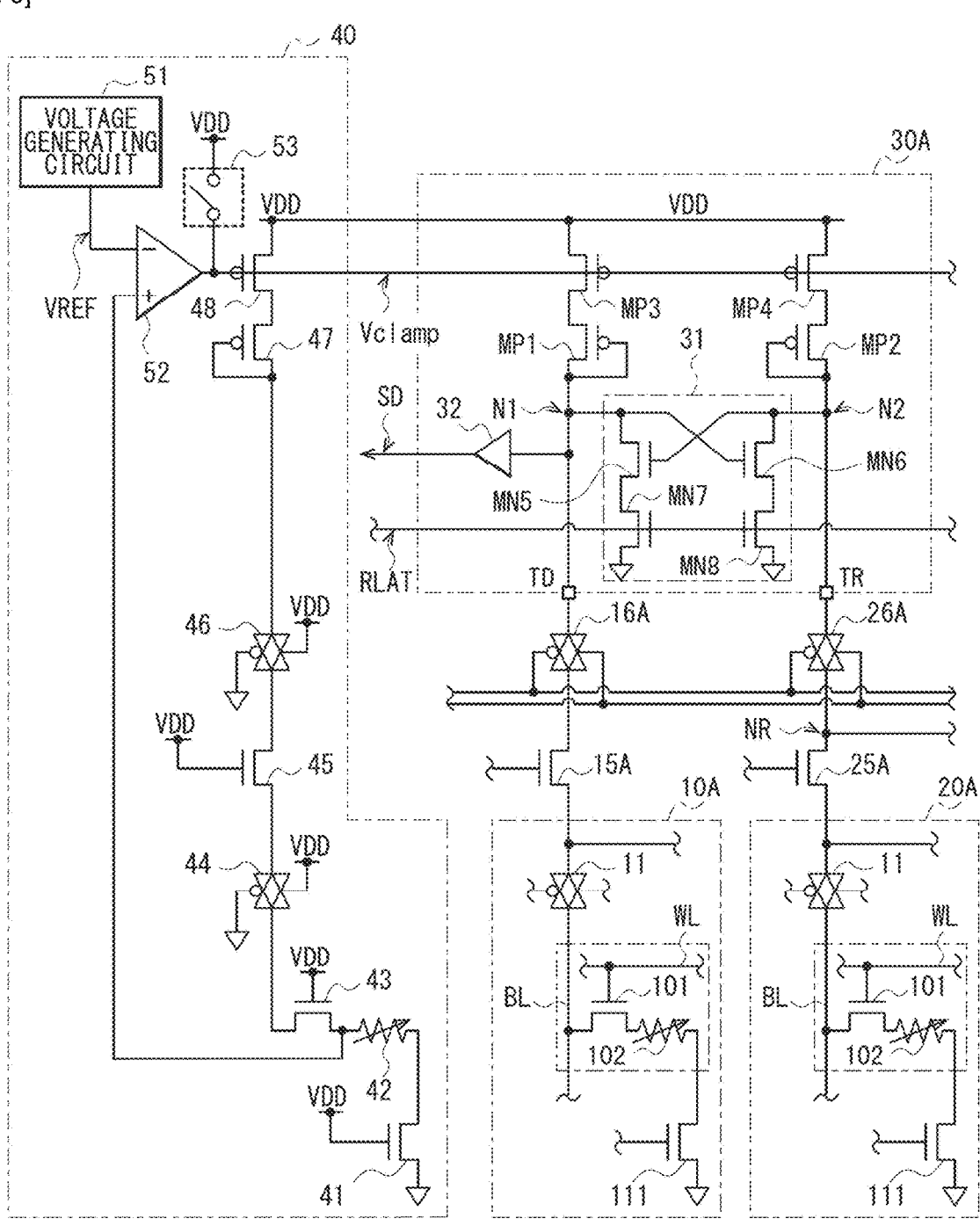

[FIG. 4]
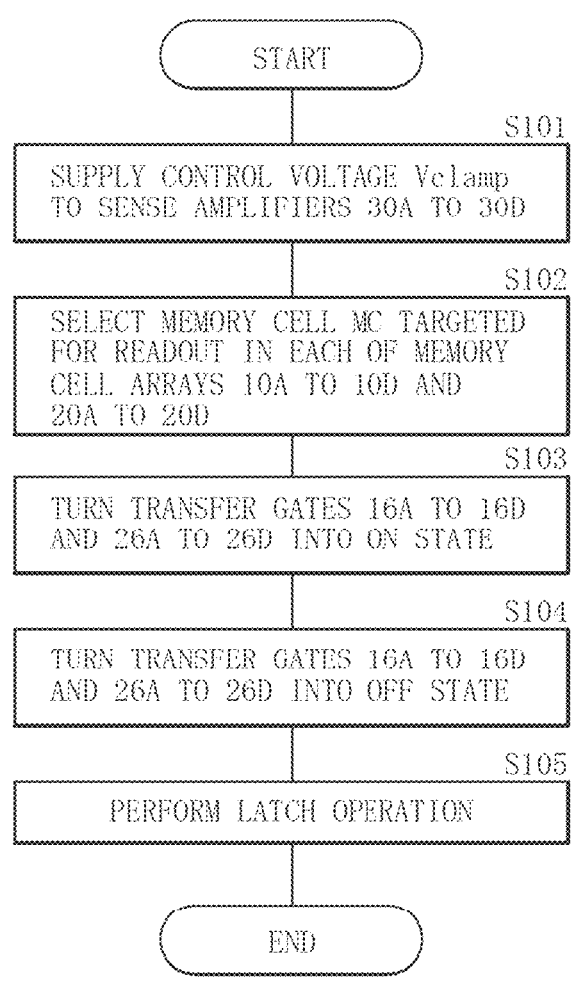

[FIG. 5]
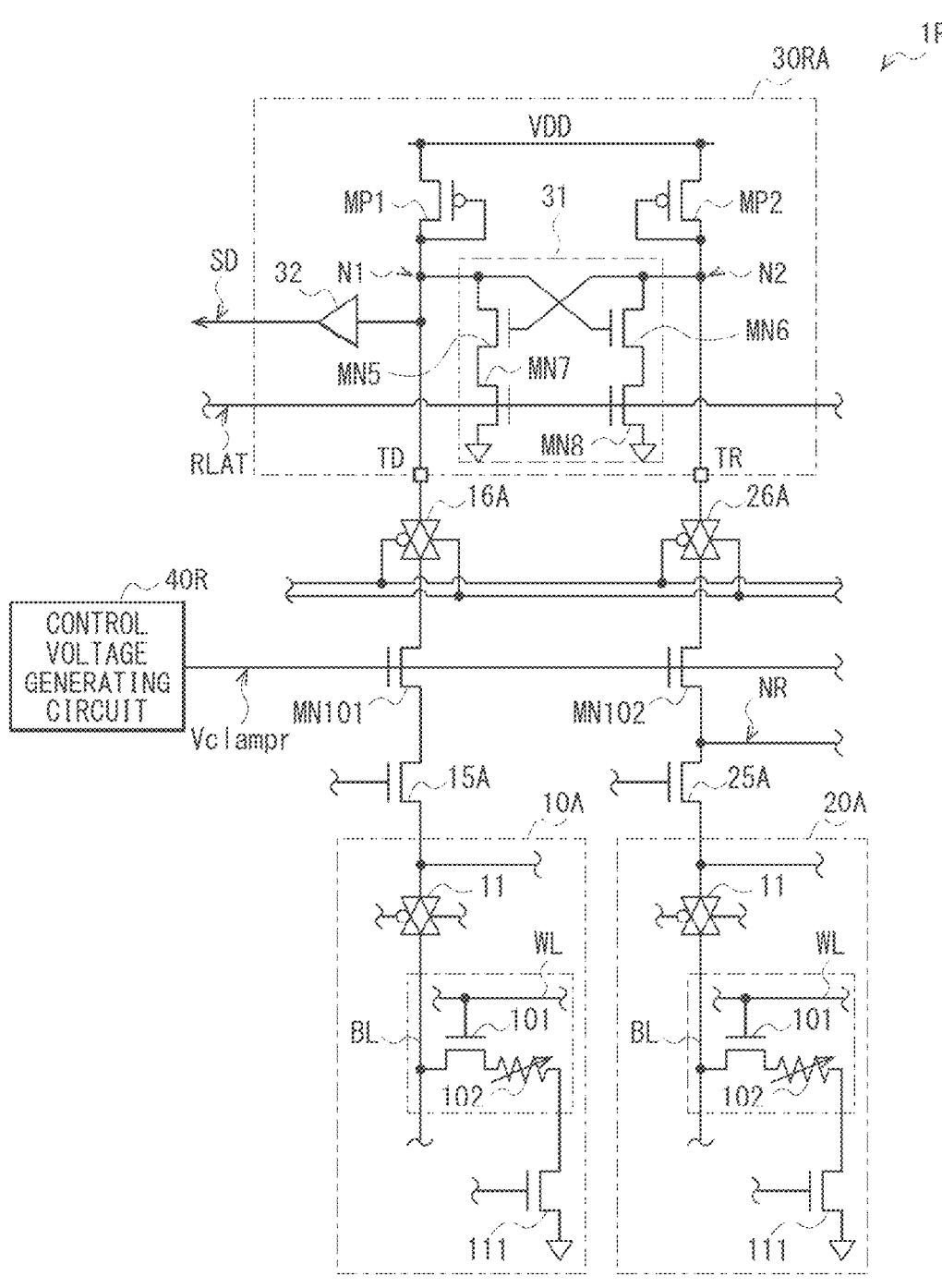

[FIG. 6]
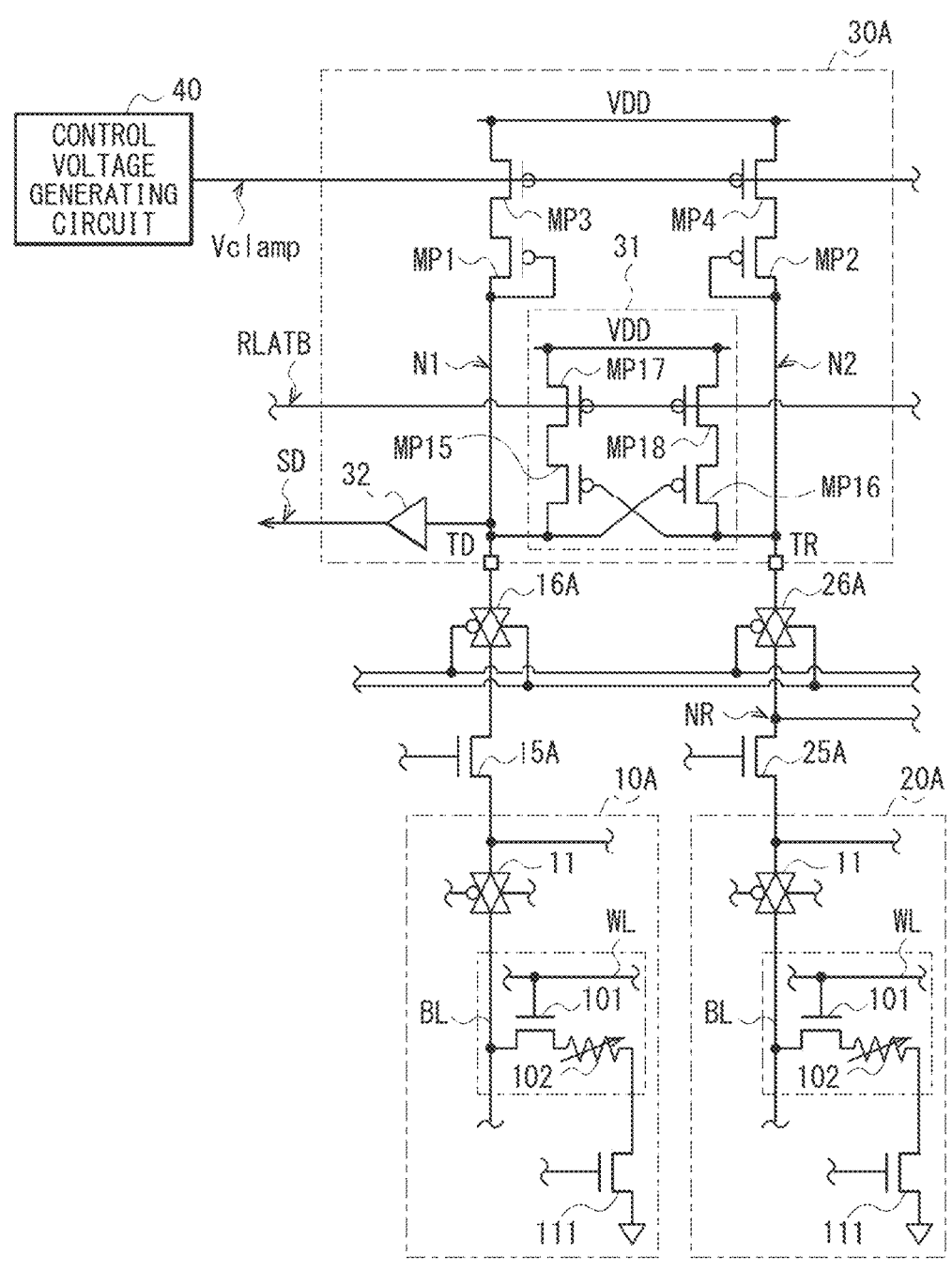

[FIG. 7]
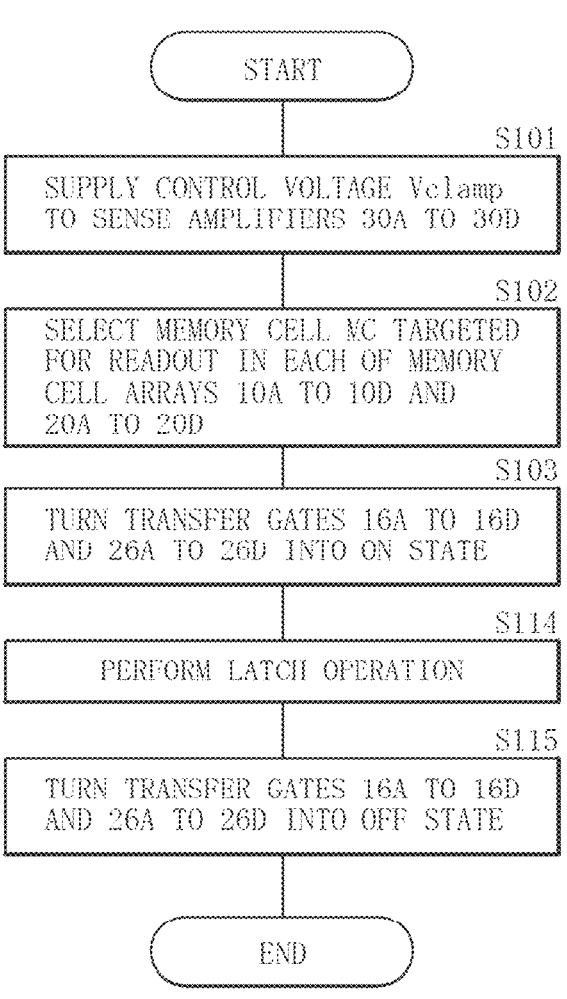

[FIG. 8]

[FIG. 9]
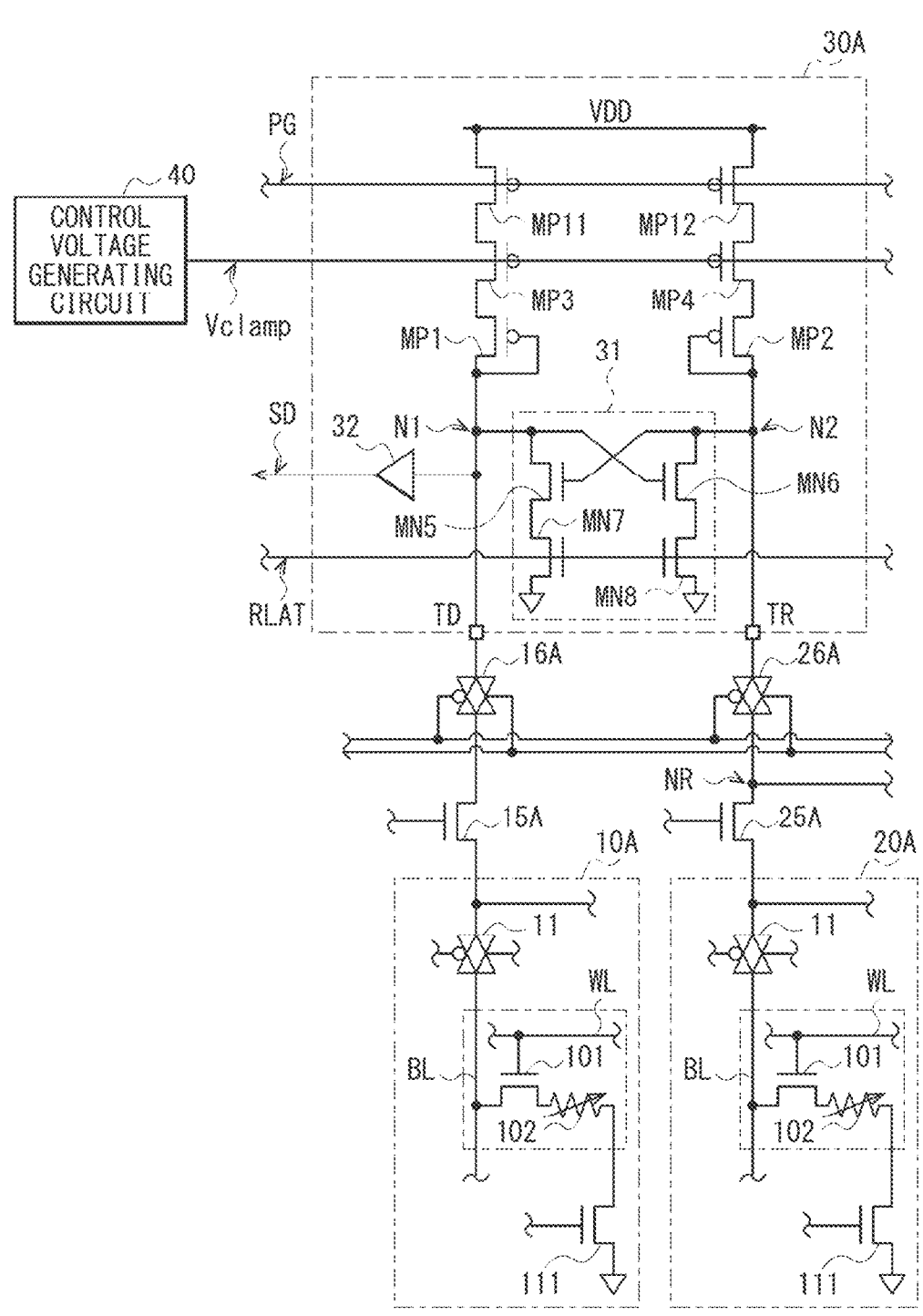

[FIG. 10]
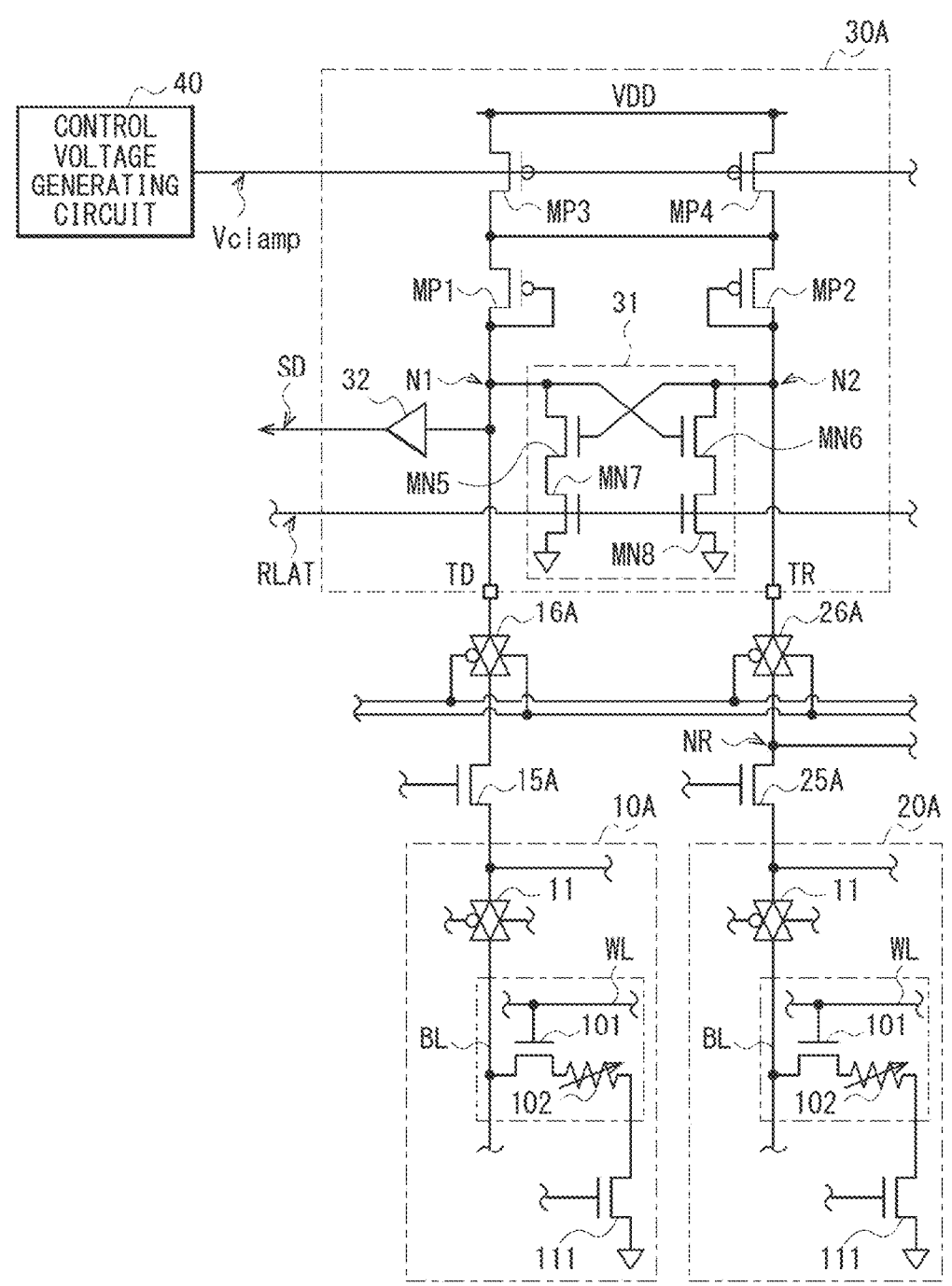

[FIG. 11]
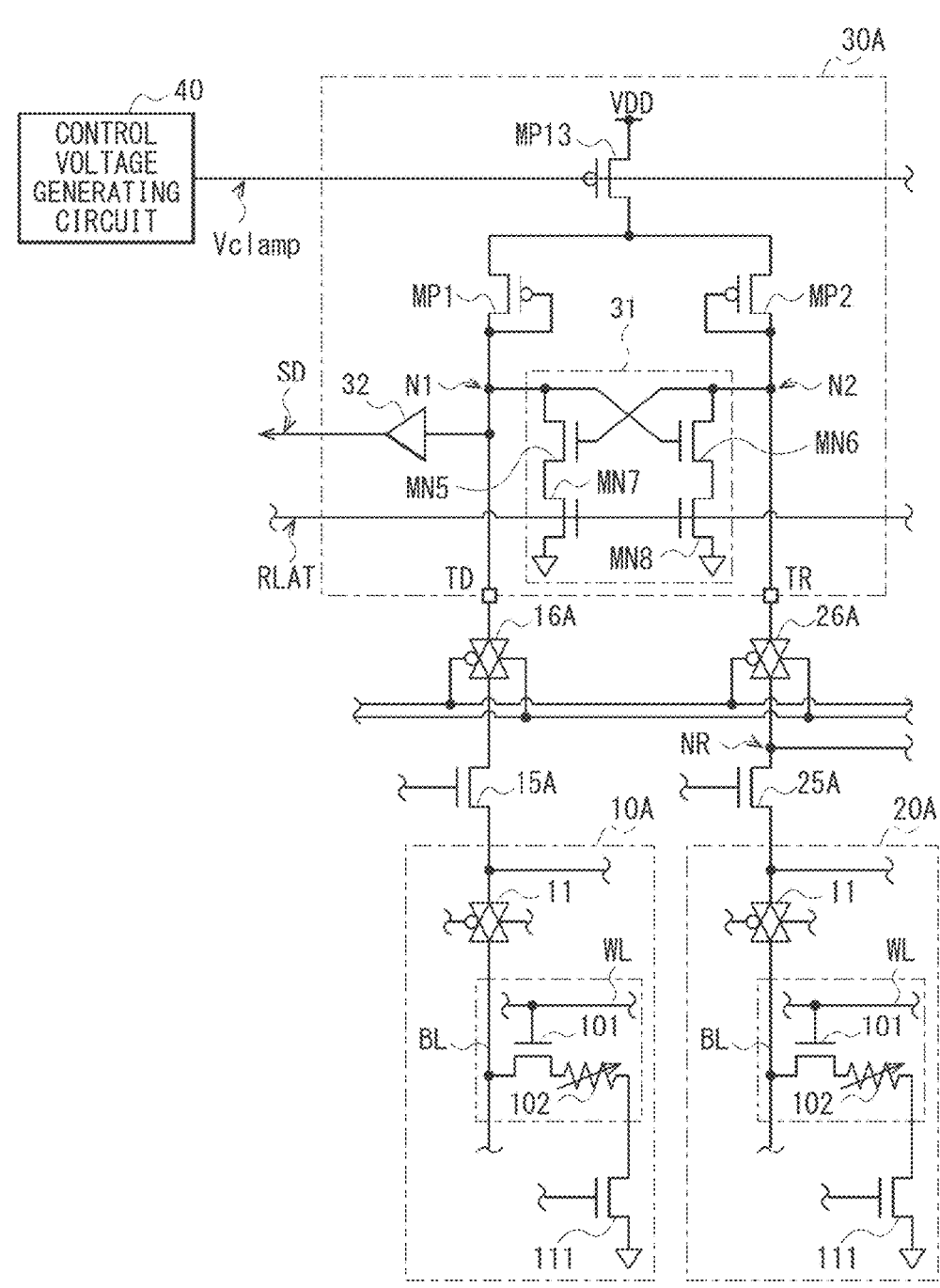

[FIG. 12]
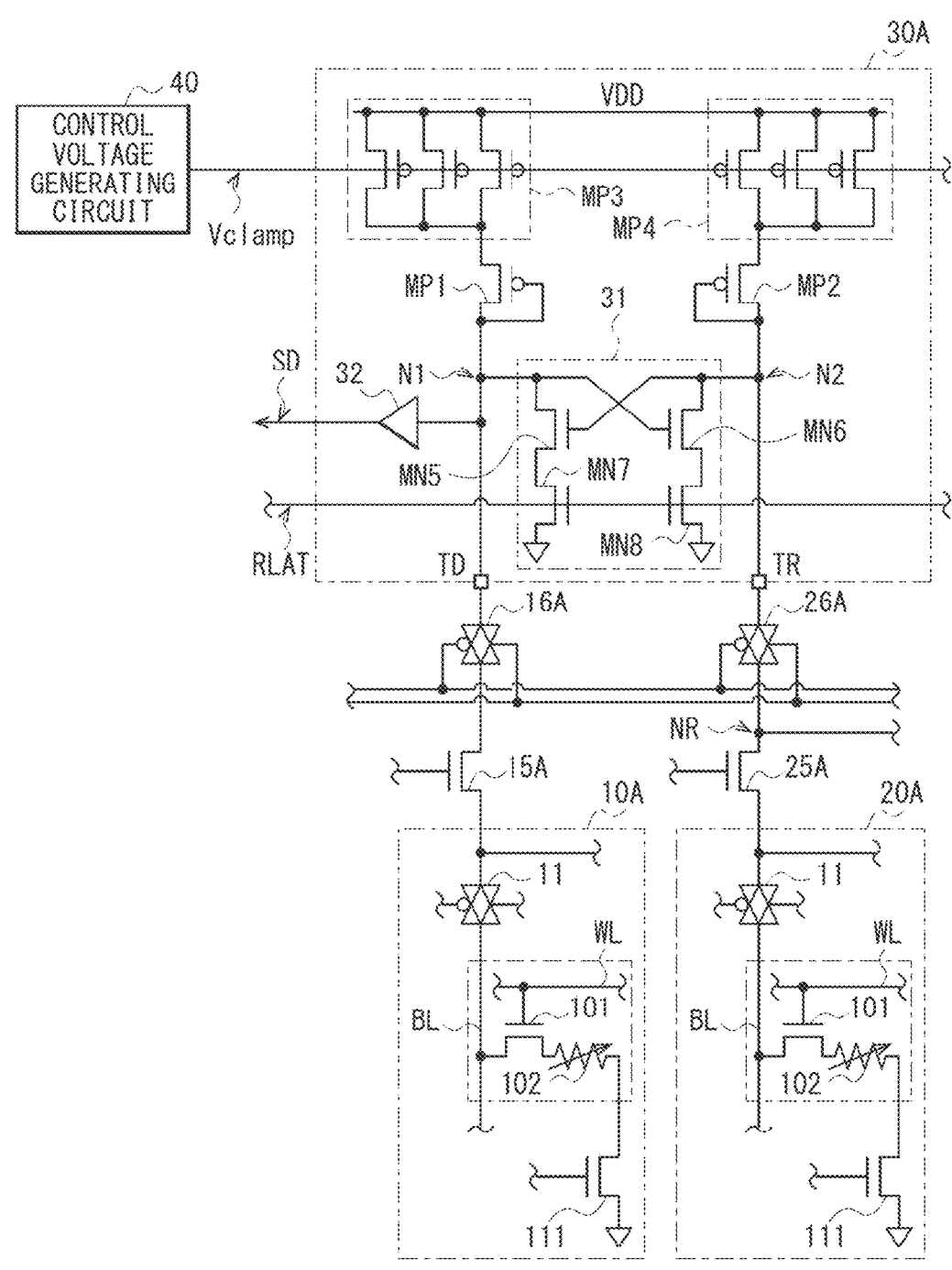

[FIG. 13]
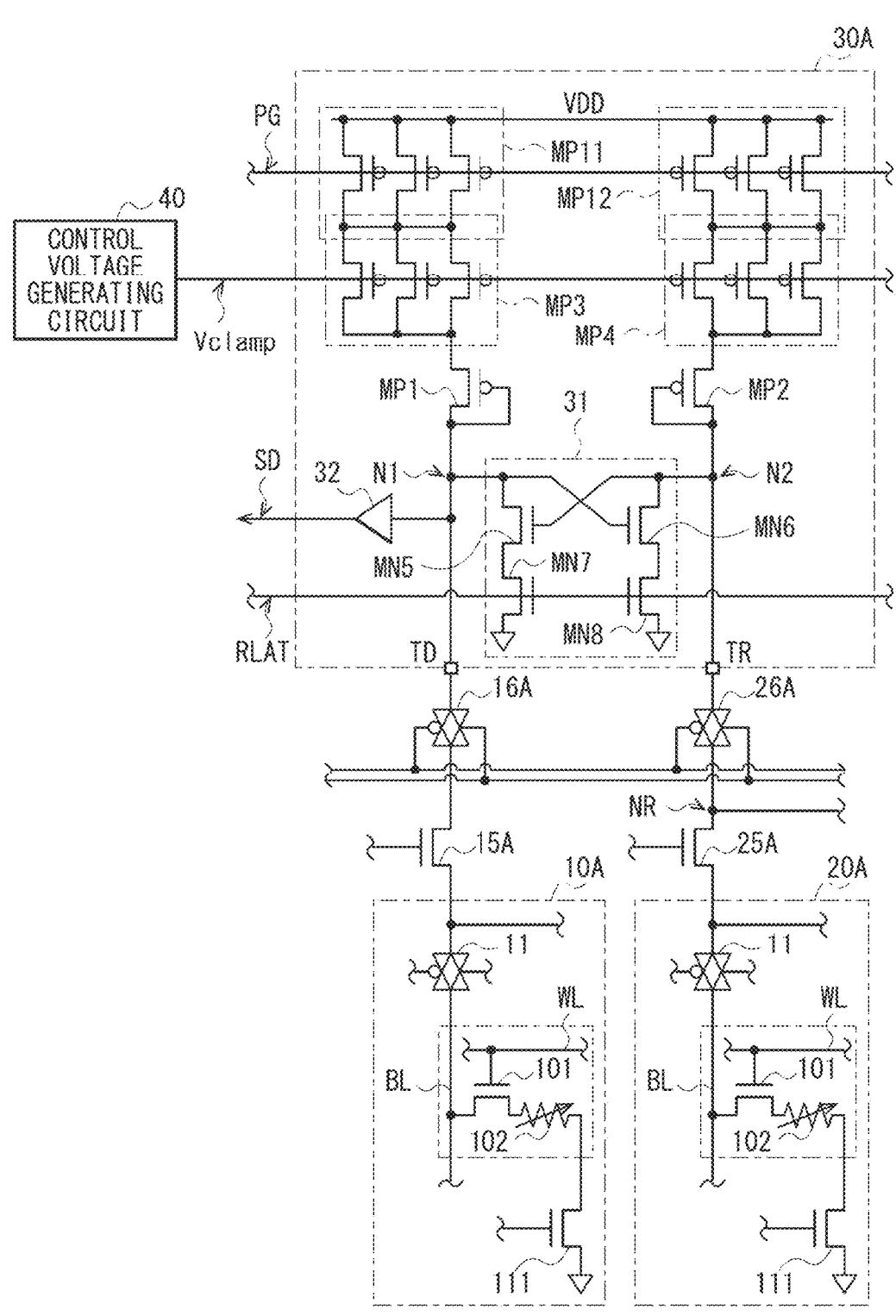

[FIG. 14]
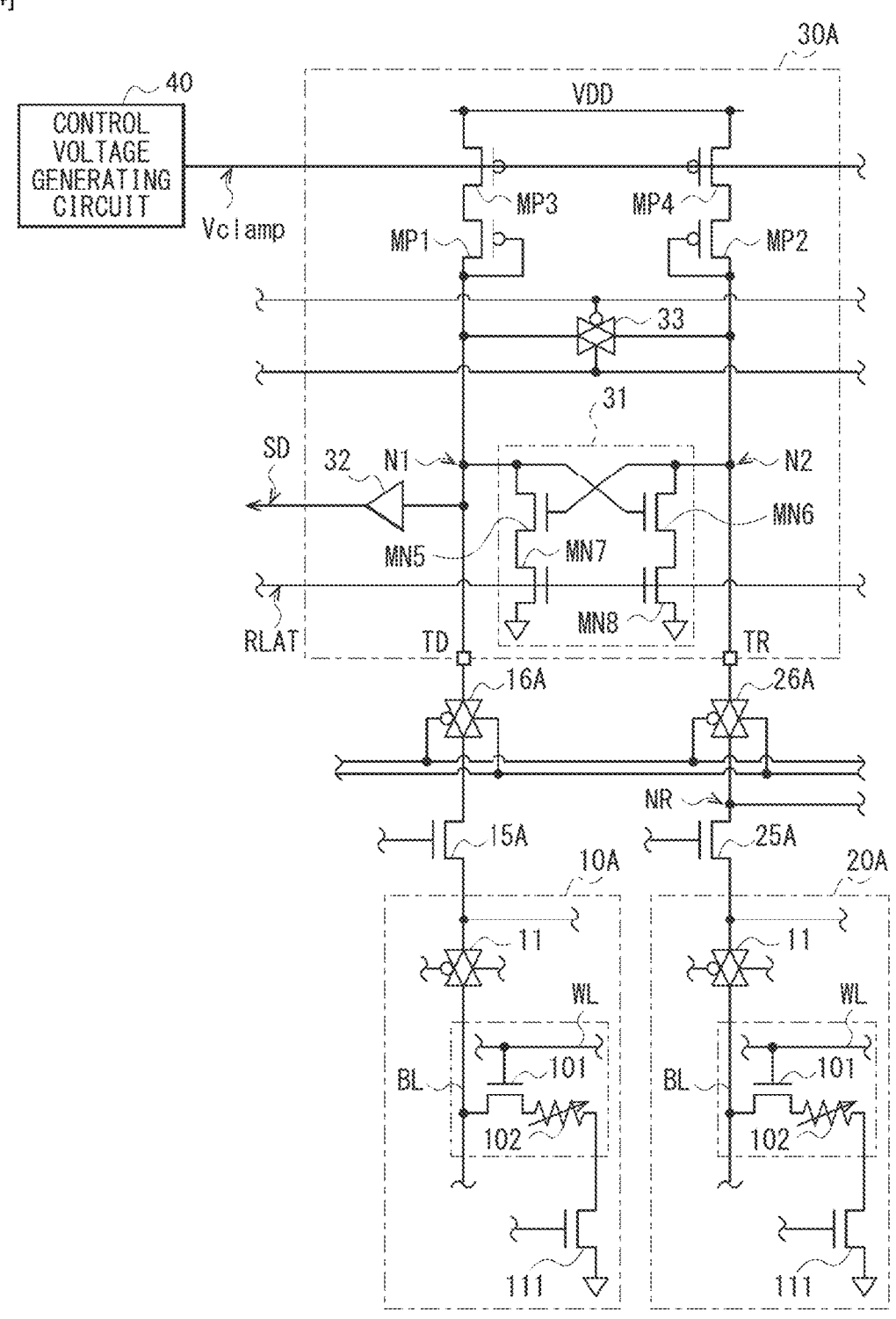

[FIG. 15]

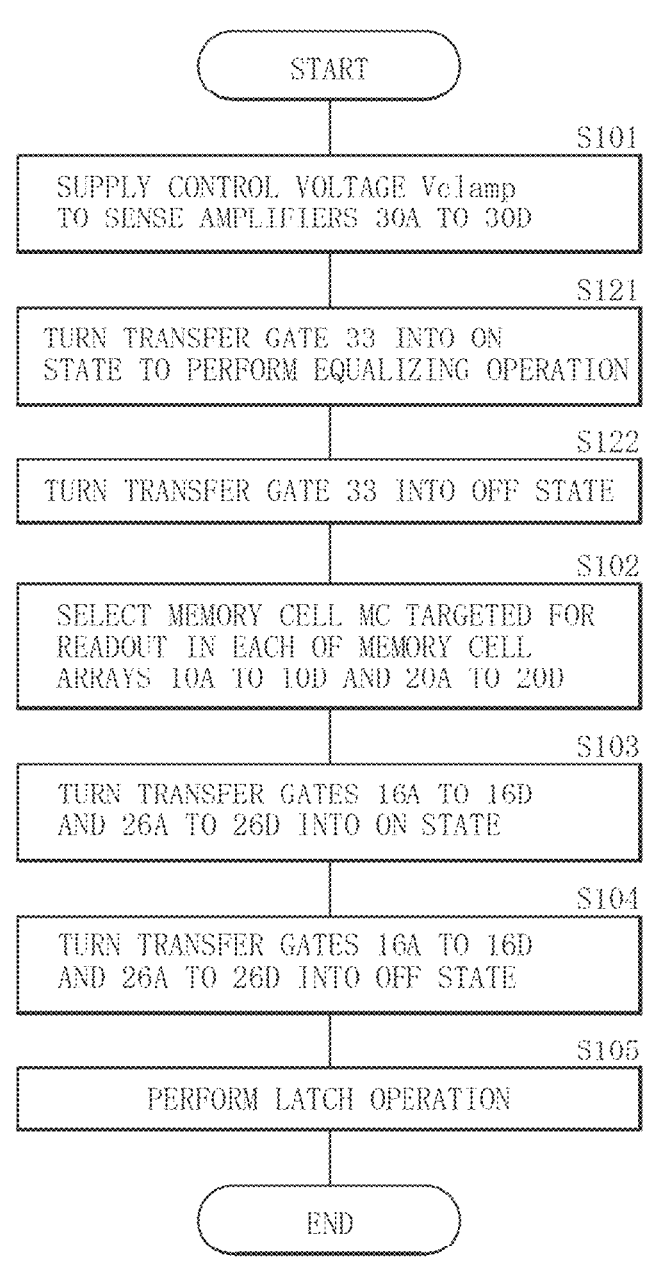

START

S101
SUPPLY CONTROL VOLTAGE Vclamp
TO SENSE AMPLIFIERS 30A TO 30D

S121
TURN TRANSFER GATE 33 INTO ON
STATE TO PERFORM EQUALIZING OPERATION

S122
TURN TRANSFER GATE 33 INTO OFF STATE

S102
SELECT MEMORY CELL MC TARGETED FOR
READOUT IN EACH OF MEMORY CELL
ARRAYS 10A TO 10D AND 20A TO 20D

S103
TURN TRANSFER GATES 16A TO 16D
AND 26A TO 26D INTO ON STATE

S104
TURN TRANSFER GATES 16A TO 16D
AND 26A TO 26D INTO OFF STATE

S105
PERFORM LATCH OPERATION

END

[FIG. 16]
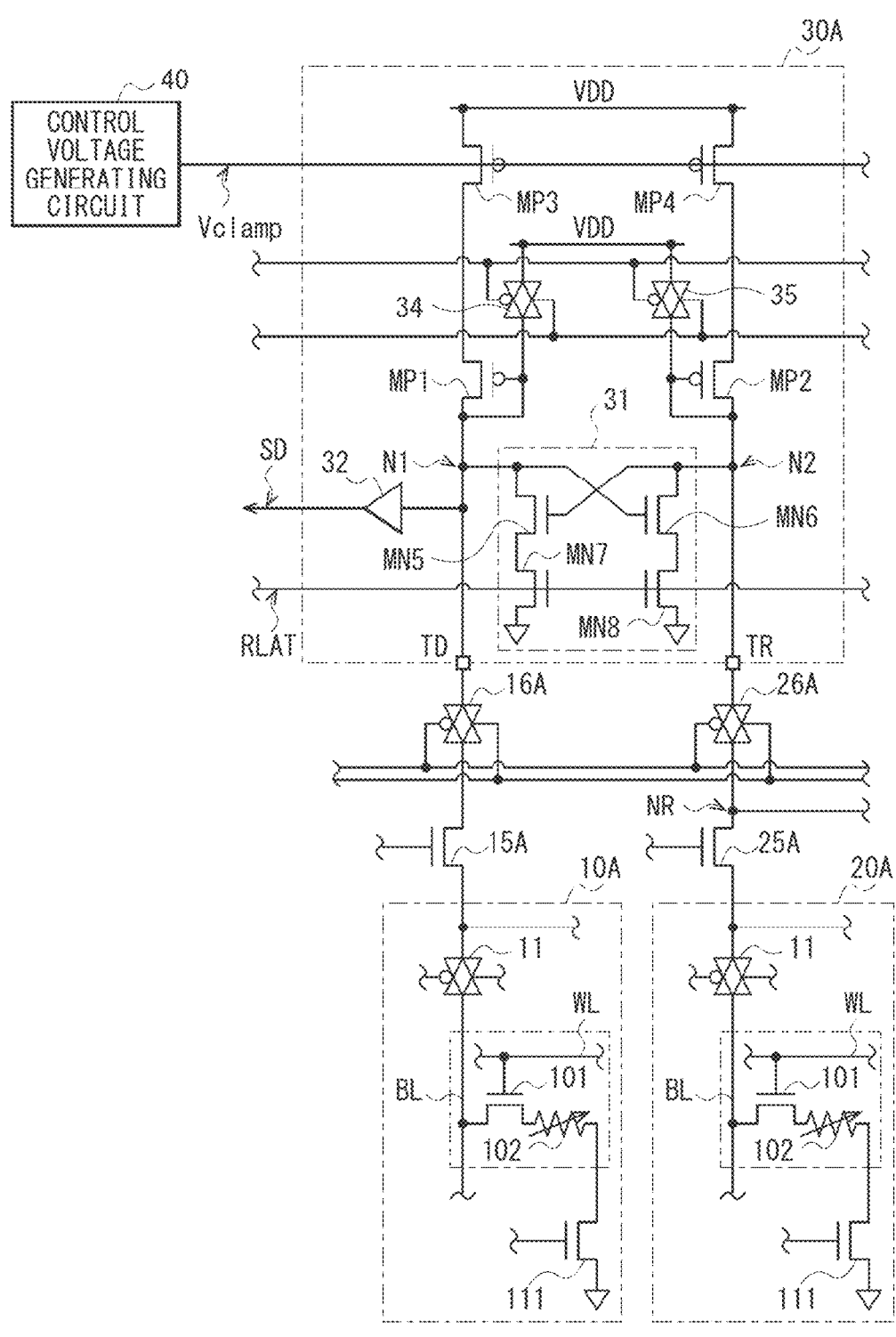

[FIG. 17]
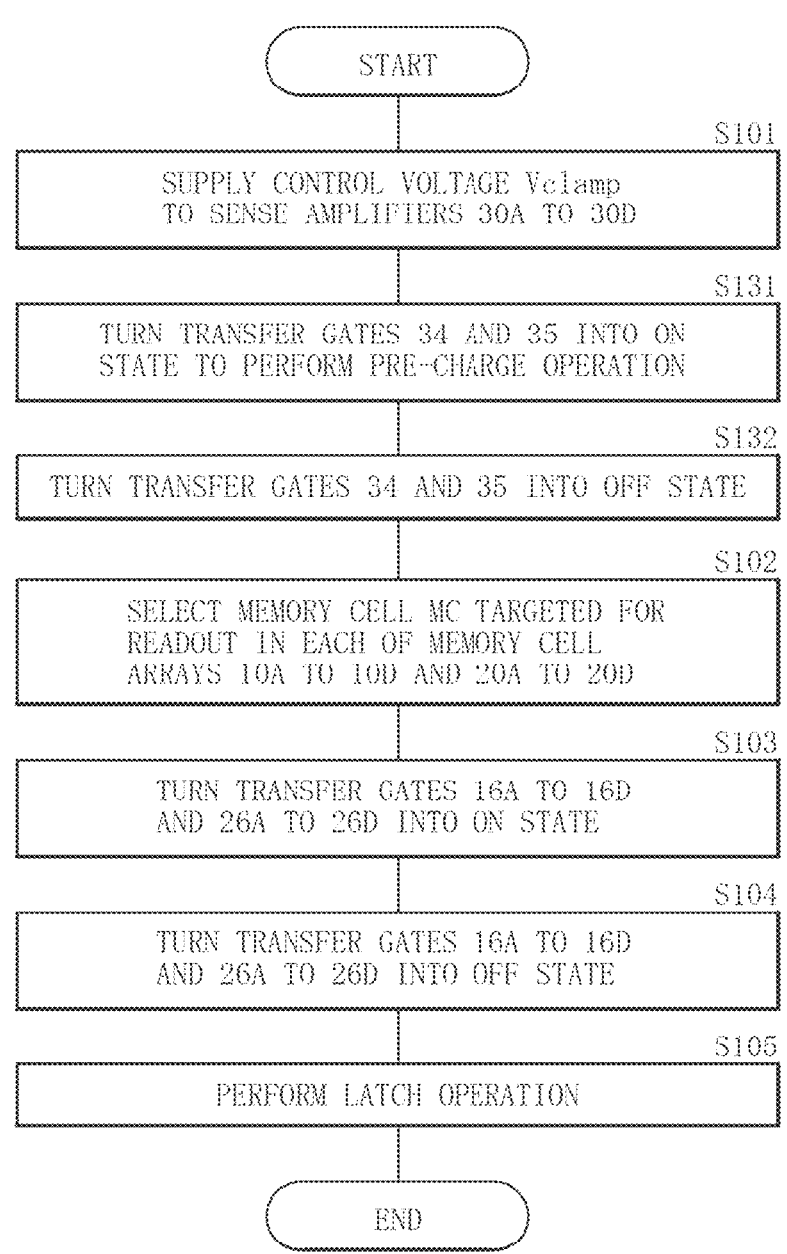

[FIG. 18]
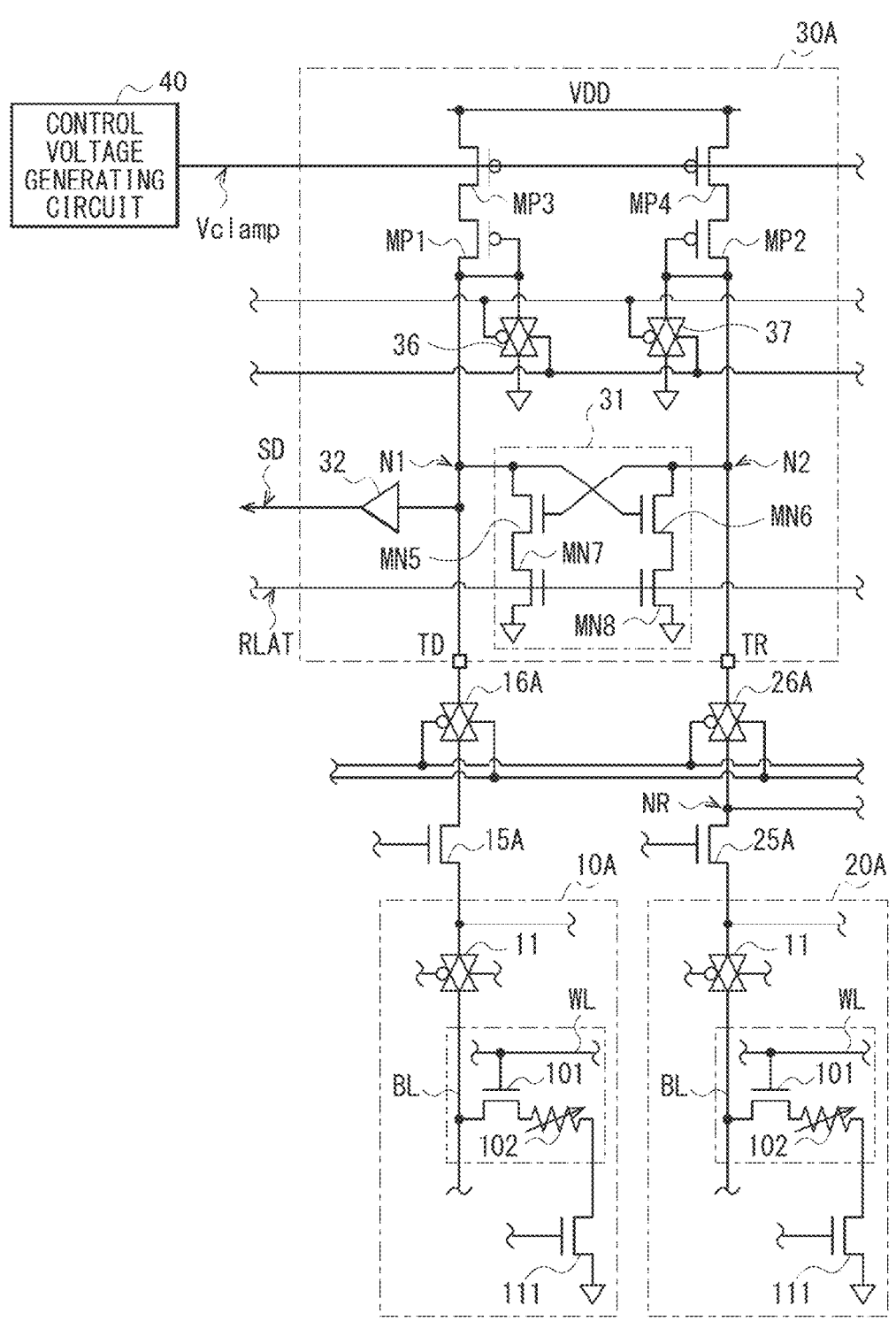

[FIG. 19]
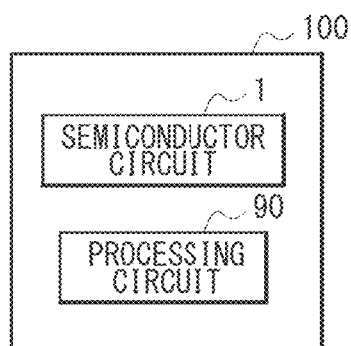

SEMICONDUCTOR CIRCUIT

CROSS REFERENCE TO RELATED APPLICATIONS

This application is a U.S. National Phase of International Patent Application No. PCT/JP2022/035906 filed on Sep. 27, 2022, which claims priority benefit of Japanese Patent Application No. JP 2021-188663 filed in the Japan Patent Office on Nov. 19, 2021. Each of the above-referenced applications is hereby incorporated herein by reference in its entirety.

TECHNICAL FIELD

The present disclosure relates to a semiconductor circuit configured to hold data.

BACKGROUND ART

A semiconductor circuit typically includes a nonvolatile memory circuit employing, for example, a resistance change memory element. For example, Patent Literature 1 discloses a memory circuit in which a current is caused to flow in a memory element using a clamp transistor, and data are read out on the basis of a voltage corresponding to a resistance value of this memory element.

CITATION LIST

Patent Literature

Patent Literature 1: Japanese Unexamined Patent Application Publication (Published Japanese Translation of PCT Application) No. 2016-511502

SUMMARY OF THE INVENTION

Incidentally, in some cases, such a semiconductor circuit is desired to perform a high-speed reading-out operation in which a large volume of data are read out in a short period of time.

It is desired to provide a semiconductor circuit that makes it possible to perform a high-speed reading-out operation.

A semiconductor circuit according to an embodiment of the present disclosure includes a first memory cell, a first signal line, a second memory cell, a second signal line, a sense amplifier, a first switch, and a second switch. The first memory cell includes a first memory element. The first signal line is coupled to the first memory cell. The second memory cell includes a second memory element. The second signal line is coupled to the second memory cell.

The sense amplifier includes a latch circuit, a first transistor, a second transistor, and a third transistor. The latch circuit is configured to apply, to a second node, a voltage inverted with respect to a voltage at a first node, and apply, to the first node, a voltage inverted with respect to a voltage at the second node. The first transistor includes a source, and includes a gate and a drain that are coupled to the first node. The second transistor includes a source, and includes a gate and a drain that are coupled to the second node. The third transistor includes a source, a gate to which a control voltage is applicable, and a drain coupled to the source of the first transistor, the source of the second transistor, or both. The first switch is configured to couple the first signal line and the first node to each other by turning into an ON state. The second switch is configured to couple the second signal line and the second node to each other by turning into an ON state.

In the semiconductor circuit according to the embodiment of the present disclosure, with the latch circuit, a voltage inverted with respect to a voltage at the first node is applied to the second node, and a voltage inverted with respect to a voltage at the second node is applied to the first node. The gate and the drain of the first transistor are coupled to the first node, and the gate and the drain of the second transistor are coupled to the second node. The drain of the third transistor is coupled to the source of the first transistor, the source of the second transistor, or both, and a control voltage is applied to the gate. Upon turning of the first switch into an ON state, the first node is coupled to the first signal line coupled to the first memory cell. Upon turning of the second switch into an ON state, the second node is coupled to the second signal line coupled to the second memory cell.

BRIEF DESCRIPTION OF DRAWING

FIG. 1 is a circuit diagram illustrating one configuration example of a semiconductor circuit according to an embodiment of the present disclosure.

FIG. 2 is a circuit diagram illustrating one configuration example of a memory cell array illustrated in FIG. 1.

FIG. 3 is a circuit diagram illustrating one configuration example of a sense amplifier and a control voltage generating circuit illustrated in FIG. 1.

FIG. 4 is a flowchart illustrating one operation example of the semiconductor circuit illustrated in FIG. 1.

FIG. 5 is a circuit diagram illustrating one configuration example of a sense amplifier according to a comparative example.

FIG. 6 is a circuit diagram illustrating one configuration example of a sense amplifier according to a modification example.

FIG. 7 is a flowchart illustrating one operation example of the semiconductor circuit including the sense amplifier illustrated in FIG. 6.

FIG. 8 is a circuit diagram illustrating one configuration example of a sense amplifier according to another modification example.

FIG. 9 is a circuit diagram illustrating one configuration example of a sense amplifier according to another modification example.

FIG. 10 is a circuit diagram illustrating one configuration example of a sense amplifier according to another modification example.

FIG. 11 is a circuit diagram illustrating one configuration example of a sense amplifier according to another modification example.

FIG. 12 is a circuit diagram illustrating one configuration example of a sense amplifier according to another modification example.

FIG. 13 is a circuit diagram illustrating one configuration example of a sense amplifier according to another modification example.

FIG. 14 is a circuit diagram illustrating one configuration example of a sense amplifier according to another modification example.

FIG. 15 is a flowchart illustrating one operation example of the semiconductor circuit including the sense amplifier illustrated in FIG. 14.

FIG. 16 is a circuit diagram illustrating one configuration example of a sense amplifier according to another modification example.

FIG. 17 is a flowchart illustrating one operation example of the semiconductor circuit including the sense amplifier illustrated in FIG. 16.

FIG. 18 is a circuit diagram illustrating one configuration example of a sense amplifier according to another modification example.

FIG. 19 is a block diagram illustrating one configuration example of a semiconductor circuit according to another modification example.

MODES FOR CARRYING OUT THE INVENTION

Below, an embodiment of the present disclosure will be described in detail with reference to the drawings.

EMBODIMENT

Configuration Example

FIG. 1 is a diagram illustrating one configuration example of a semiconductor circuit (semiconductor circuit 1) according to an embodiment. The semiconductor circuit 1 is a nonvolatile memory circuit that holds data. The semiconductor circuit 1 includes a control circuit 9, four memory cell arrays 10 (memory cell arrays 10A, 10B, 10C, and 10D), four transistors 15 (transistors 15A, 15B, 15C, and 15D), four transfer gates 16 (transfer gates 16A, 16B, 16C, and 16D), four memory cell arrays 20 (memory cell arrays 20A, 20B, 20C, and 20D), four transistors 25 (transistors 25A, 25B, 25C, and 25D), four transfer gates 26 (transfer gates 26A, 26B, 26C, and 26D), four sense amplifiers 30 (sense amplifiers 30A, 30B, 30C, and 30D), and a control voltage generating circuit 40. In this manner, in this example, there are provided four circuit groups each including the memory cell arrays 10 and 20, the transistors 15 and 25, the transfer gates 16 and 26, and the sense amplifier 30. Note that the configuration is not limited to this, and for example, more than four circuit groups may be provided.

The control circuit 9 is configured so as to control operations of the semiconductor circuit 1. Specifically, the control circuit 9 is configured to control operations of the semiconductor circuit 1 so as to write data on the four memory cell arrays 10 on the basis of a writing command and writing data supplied from the outside, and to control operations of the semiconductor circuit 1 to read out data from the four memory cell arrays 10 on the basis of a reading-out command supplied from the outside.

The memory cell arrays 10A, 10B, 10C, and 10D are configured to hold data.

FIG. 2 is a diagram illustrating one configuration example of the memory cell array 10A. The configurations of the memory cell arrays 10B, 10C, and 10D are similar to the configuration of the memory cell array 10A. The memory cell array 10A includes a plurality of word lines WL, four bit lines BL, a plurality of memory cells MC, four transistors 111 to 114, and four transfer gates 11 to 14.

The plurality of word lines WL extends in a horizontal direction in FIGS. 1 and 2, and is provided adjacent to each other in a vertical direction. In each of the four memory cell arrays 10A, 10B, 10C, and 10D, the plurality of word lines WL is coupled to each other between the memory cell arrays. The plurality of word lines WL is coupled to the control circuit 9, and a control signal used to select a memory cell MC is supplied from the control circuit 9.

The four bit lines BL extend in the vertical direction in FIGS. 1 and 2, and are provided adjacent to each other in the horizontal direction. The plurality of bit lines BL are each correspondingly coupled to the four transfer gates 11 to 14.

The plurality of memory cells MC is each configured so as to hold data. In this example, the plurality of memory cells MC includes four columns of memory cells MC corresponding to the four bit lines BL. The memory cell MC includes a transistor 101 and a memory element 102.

The transistor 101 is an N-type MOS (Metal Oxide Semiconductor) transistor in which the source thereof is coupled to the bit line BL, the gate is coupled to the word line WL, and the drain is coupled to the memory element 102.

The memory element 102 is a nonvolatile memory element, and is configured to hold information by using a reversible change of a resistance state, the reversible change corresponding to a direction of a current. In this example, the memory element 102 is a magnetic tunnel junction (MTJ) element. The memory element 102 includes one end coupled to the drain of the transistor 101 and the other end coupled to any one of the transistors 111 to 114. Specifically, the other end of the memory element 102 in a memory cell MC disposed at the first column from the left is coupled to the drain of the transistor 111. The other end of the memory element 102 in a memory cell MC disposed at the second column from the left is coupled to the drain of the transistor 112. The other end of the memory element 102 in a memory cell MC disposed at the third column from the left is coupled to the drain of the transistor 113. The other end of the memory element 102 in a memory cell MC disposed at the fourth column from the left is coupled to the drain of the transistor 114.

The resistance state of the memory element 102 is set to a resistance state corresponding to the direction of a current in a case where an electric current value of a current flowing between both ends is higher than a current threshold value TH. It is possible for the resistance state to take a low-resistance state RL or a high-resistance state RH. The low-resistance state RL represents a state in which the resistance value between both ends is low, and the high-resistance state RH represents a state in which the resistance value between both ends is high. Specifically, for example, in a case where a current higher than the current threshold value TH flows from one end toward the other end, the resistance state of the memory element 102 is set to the high-resistance state. In addition, for example, in a case where a current higher than the current threshold value TH flows from the other end toward one end, the resistance state of the memory element 102 is set to the low-resistance state RL. Although illustration is not provided in FIG. 2 as to the configuration of performing a writing operation to set the resistance state of the memory element 102, a circuit is added in FIG. 2, for example. This circuit is configured to, in a writing operation, be able to cause a current to flow from one end of the memory element 102 to the other end on the basis of an instruction from the control circuit 9, or cause a current to flow from the other end of the memory element 102 to one end. In the writing operation, the control circuit 9 is configured so as to be able to select one of the plurality of memory cells MC on the basis of an address signal contained in the writing command, and set the resistance state of the memory element 102 of the selected memory cell MC to the low-resistance state RL or the high-resistance state RH.

The four transistors 111 to 114 are N-type MOS transistors, and are each provided so as to correspond to memory cells MC of each of four columns. The drain of the transistor 111 is coupled to the other ends of the memory elements 102 in the plurality of memory cells MC disposed at the first column from the left; the gate thereof is supplied with a control signal from the control circuit 9; and the source thereof is grounded. The drain of the transistor 112 is coupled to the other ends of the memory elements 102 in the plurality of memory cells MC disposed at the second column from the left; the gate thereof is supplied with a control signal from the control circuit 9; and the source thereof is grounded. The drain of the transistor 113 is coupled to the other ends of the memory elements 102 in the plurality of memory cells MC disposed at the third column from the left; the gate thereof is supplied with a control signal from the control circuit 9; and the source thereof is grounded. The drain of the transistor 114 is coupled to the other ends of the memory elements 102 in the plurality of memory cells MC disposed at the fourth column from the left; the gate thereof is supplied with a control signal from the control circuit 9; and the source thereof is grounded. In a case where the transistor 111 turns into an ON state, the four transistors 111 in the memory cell arrays 10A to 10D turn into an ON state.

The four transfer gates 11 to 14 are each provided so as to correspond to memory cells MC of each of four columns. The transfer gate 11 includes one end coupled to the source of the transistor 15A and the other end coupled to the first bit line BL from the left. The transfer gate 11 is configured to turn on and off on the basis of a control signal from the control circuit 9. The transfer gate 12 includes one end coupled to the source of the transistor 15A and the other end coupled to the second bit line BL from the left. The transfer gate 12 is configured to turn on and off on the basis of a control signal from the control circuit 9. The transfer gate 13 includes one end coupled to the source of the transistor 15A and the other end coupled to the third bit line BL from the left. The transfer gate 13 is configured to turn on and off on the basis of a control signal from the control circuit 9. The transfer gate 14 includes one end coupled to the source of the transistor 15A and the other end coupled to the fourth bit line BL from the left. The transfer gate 14 is configured to turn on and off on the basis of a control signal from the control circuit 9. In a case where the transfer gate 11 turns into the ON state, the four transfer gates 11 in the memory cell arrays 10A to 10D turn into the ON state.

The transistor 15A (FIG. 1) is an N-type MOS transistor in which the drain thereof is coupled to the transfer gate 16A, the gate thereof is supplied with a control signal from the control circuit 9, and the source thereof is coupled to one ends of the four transfer gates 11 to 14 in the memory cell array 10A. Similarly, the drain of the transistor 15B is coupled to the transfer gate 16B. The gate thereof is supplied with a control signal from the control circuit 9. The source thereof is coupled to one ends of the four transfer gates 11 to 14 in the memory cell array 10B. The drain of the transistor 15C is coupled to the transfer gate 16C. The gate thereof is supplied with a control signal from the control circuit 9. The source thereof is coupled to one ends of the four transfer gates 11 to 14 in the memory cell array 10C. The drain of the transistor 15D is coupled to the transfer gate 16D. The gate thereof is supplied with a control signal from the control circuit 9. The source thereof is coupled to one ends of the four transfer gates 11 to 14 in the memory cell array 10D.

The transfer gate 16A has one end coupled to a terminal TD of the sense amplifier 30A and the other end coupled to the drain of the transistor 15A. The transfer gate 16A is configured to turn on and off on the basis of a control signal from the control circuit 9. Similarly, the transfer gate 16B includes one end coupled to the terminal TD of the sense amplifier 30B and the other end coupled to the drain of the transistor 15B. The transfer gate 16B is configured to turn on and off on the basis of a control signal from the control circuit 9. The transfer gate 16C includes one end coupled to the terminal TD of the sense amplifier 30C and the other end coupled to the drain of the transistor 15C. The transfer gate 16C is configured to turn on and off on the basis of a control signal from the control circuit 9. The transfer gate 16D includes one end coupled to the terminal TD of the sense amplifier 30D and the other end coupled to the drain of the transistor 15D. The transfer gate 16D is configured to turn on and off on the basis of a control signal from the control circuit 9.

With this configuration, in a reading-out operation, the control circuit 9 selects one of the plurality of memory cells MC in each of the memory cell arrays 10A, 10B, 10C, and 10D, on the basis of an address signal contained in a reading-out command. Specifically, the control circuit 9 supplies a control signal to the transfer gates 11 to 14 to turn one of the transfer gates 11 to 14 into the ON state. For example, in a case of turning the transfer gate 11 into the ON state, the control circuit 9 turns, into the ON state, four transfer gates 11 in the memory cell arrays 10A to 10D. In addition, the control circuit 9 supplies a control signal to the transistors 111 to 114 to turn, into the ON state, a transistor corresponding to the transfer gate to be turned into the ON state from among the transfer gates 11 to 14. Specifically, the control circuit 9: turns the transistor 111 into the ON state in a case of turning the transfer gate 11 into the ON state; turns the transistor 112 into the ON state in a case of turning the transfer gate 12 into the ON state; turns the transistor 113 into the ON state in a case of turning the transfer gate 13 into the ON state; and turns the transistor 114 into the ON state in a case of turning the transfer gate 14 into the ON state. For example, in a case of turning the transistor 111 into the ON state, the control circuit 9 turns, into the ON state, the four transistors 111 in the memory cell arrays 10A to 10D. Furthermore, the control circuit 9 turns a voltage of one of the plurality of word lines WL into the high level. With this configuration, the control circuit 9 selects one memory cell from the plurality of memory cells MC in each of the memory cell arrays 10A to 10D.

In addition, the control circuit 9 is configured to: couple the selected memory cell MC in the memory cell array 10A to the terminal TD of the sense amplifier 30A through the transistor 15A and the transfer gate 16A; couple the selected memory cell MC in the memory cell array 10B to the terminal TD of the sense amplifier 30B through the transistor 15B and the transfer gate 16B; couple the selected memory cell MC in the memory cell array 10C to the terminal TD of the sense amplifier 30C through the transistor 15C and the transfer gate 16C; and couple the selected memory cell MC in the memory cell array 10D to the terminal TD of the sense amplifier 30D through the transistor 15D and the transfer gate 16D.

The memory cell arrays 20A, 20B, 20C, and 20D (FIG. 1) are configured to hold reference data serving as predetermined data. That is, the memory cell arrays 10A, 10B, 10C, and 10D hold any given data, whereas the memory cell arrays 20A, 20B, 20C, and 20D hold the reference data serving as the predetermined data. The memory cell arrays 20A to 20D have configurations similar to the configuration (FIG. 2) of the memory cell array 10A.

The transistor 25A is an N-type MOS transistor in which the drain thereof is coupled to a node NR, the gate is supplied with a control signal from the control circuit 9, and the source is coupled to one ends of the four transfer gates 11 to 14 in the memory cell array 20A. Similarly, the drain of the transistor 25B is coupled to the node NR. The gate thereof is supplied with a control signal from the control circuit 9. The source thereof is coupled to one ends of the four transfer gates 11 to 14 in the memory cell array 20B. The drain of the transistor 25C is coupled to the node NR. The gate thereof is supplied with a control signal from the control circuit 9. The source thereof is coupled to one ends of the four transfer gates 11 to 14 in the memory cell array 20C. The drain of the transistor 25D is coupled to the node NR. The gate thereof is supplied with a control signal from the control circuit 9. The source thereof is coupled to one ends of the four transfer gates 11 to 14 in the memory cell array 20D.

The transfer gate 26A includes one end coupled to a terminal TR of the sense amplifier 30A and the other end coupled to the node NR. The transfer gate 26A is configured to turn on and off on the basis of a control signal from the control circuit 9. Similarly, the transfer gate 26B includes one end coupled to the terminal TR of the sense amplifier 30B and the other end coupled to the node NR. The transfer gate 26B is configured to turn on and off on the basis of a control signal from the control circuit 9. The transfer gate 26C includes one end coupled to the terminal TR of the sense amplifier 30C and the other end coupled to the node NR. The transfer gate 26C is configured to turn on and off on the basis of a control signal from the control circuit 9. The transfer gate 26D includes one end coupled to the terminal TR of the sense amplifier 30D and the other end coupled to the node NR. The transfer gate 26D is configured to turn on and off on the basis of a control signal from the control circuit 9.

In this manner, at the node NR, the drains of the transistors 25A, 25B, 25C, and 25D are coupled to the other ends of the transfer gate 26A, 26B, 26C, 26D, respectively.

With this configuration, in the reading-out operation, the control circuit 9 selects one of the plurality of memory cells MC in each of the memory cell arrays 20A, 20B, 20C, and 20D. Specifically, the control circuit 9 supplies a control signal to the transfer gates 11 to 14 to turn one of the transfer gates 11 to 14 into the ON state. For example, in a case of turning the transfer gate 11 into the ON state, the control circuit 9 turns, into the ON state, four transfer gates 11 in the memory cell arrays 20A to 20D. In addition, the control circuit 9 supplies control signal to the transistors 111 to 114 to turn, into the ON state, a transistor corresponding to the transfer gate to be turned into the ON state, from among the transfer gates 11 to 14. Specifically, the control circuit 9: turns the transistor 111 into the ON state in a case of turning the transfer gate 11 into the ON state; turns the transistor 112 into the ON state in a case of turning the transfer gate 12 into the ON state; turns the transistor 113 into the ON state in a case of turning the transfer gate 13 into the ON state; and turns the transistor 114 into the ON state in a case of turning the transfer gate 14 into the ON state. For example, in a case of turning the transistor 111 into the ON state, the control circuit 9 turns, into the ON state, the four transistors 111 in the memory cell arrays 20A to 20D. Furthermore, the control circuit 9 turns a voltage of one of the plurality of word lines WL into the high level. With this configuration, the control circuit 9 selects one memory cell from the plurality of memory cells MC in each of the memory cell arrays 20A to 20D.

The memory cell arrays 20A, 20B, 20C, and 20D hold the reference data serving as the predetermined data. In the memory cell arrays 20A to 20D that hold the reference data, four memory elements 102 in the selected four memory cells MC include two memory elements 102 in which the resistance state is the low-resistance state RL, and two memory element 102 in which the resistance state is the high-resistance state RH. The control circuit 9 couples the selected memory cell MC in each of the memory cell arrays 20A to 20D to the terminal TR of the sense amplifiers 30A to 30D through the transistors 25A to 25D and the transfer gates 26A to 26D. With this configuration, a memory element having the same resistance value as the average values of resistance values of these four memory elements 102 is equivalently coupled to the terminal TR of each of the sense amplifiers 30A to 30D.

In the reading-out operation, the sense amplifier 30A is configured to compare a voltage at the terminal TD with a voltage at the terminal TR to read out the data held in the memory cell array 10A, and supply the control circuit 9 with a signal SD indicating a result of reading-out. Similarly, in the reading-out operation, the sense amplifier 30B is configured to compare a voltage at the terminal TD with a voltage at the terminal TR to read out the data held in the memory cell array 10B, and supply the control circuit 9 with the signal SD indicating a result of reading-out. In the reading-out operation, the sense amplifier 30C is configured to compare a voltage at the terminal TD with a voltage at the terminal TR to read out the data held in the memory cell array 10C, and supply the control circuit 9 with a signal SD indicating a result of reading-out. In the reading-out operation, the sense amplifier 30D is configured to compare a voltage at the terminal TD with a voltage at the terminal TR to read out the data held in the memory cell array 10D, and supply the control circuit 9 with the signal SD indicating a result of reading-out.

FIG. 3 is a diagram illustrating one configuration example of the sense amplifier 30A. The sense amplifiers 30B, 30C, and 30D have a configuration similar to the configuration of the sense amplifier 30A. Note that, in addition to the sense amplifier 30A, FIG. 3 also illustrates a portion of the memory cell arrays 10A and 20A, the transistors 15A and 25A, the transfer gates 16A and 26A, and the control voltage generating circuit 40. The sense amplifier 30A includes transistors MP1 to MP4, a latch circuit 31, and a buffer 32.

The transistors MP1 to MP4 are P-type MOS transistors. The gate and the drain of the transistor MP1 are coupled to the node N1, and the source thereof is coupled to the drain of the transistor MP3. The gate and the drain of the transistor MP2 are coupled to the node N2, and the source thereof is coupled to the drain of the transistor MP4. The gate of the transistor MP3 is supplied with a control voltage Vclamp from the control voltage generating circuit 40. The source thereof is coupled to a power supply node of a power supply voltage VDD. The drain thereof is coupled to the source of the transistor MP1. The gate of the transistor MP4 is supplied with a control voltage Vclamp from the control voltage generating circuit 40. The source thereof is coupled to the power supply node of the power supply voltage VDD. The drain thereof is coupled to the source of the transistor MP2.

The latch circuit 31 is configured so as to perform a latch operation on the basis of a voltage at the node N1 coupled to the terminal TD and a voltage at the node N2 coupled to the terminal TR. The latch circuit 31 includes transistors MN5 to MN8. The transistors MN5 to MN8 are N-type MOS transistors. The gate of the transistor MN5 is coupled to the node N2. The drain thereof is coupled to the node N1. The source thereof is coupled to the drain of the transistor MN7. The gate of the transistor MN6 is coupled to the node N1. The drain thereof is coupled to the node N2. The source thereof is coupled to the drain of the transistor MN8. The gate of the transistor MN7 is supplied with a signal RLAT from the control circuit 9. The drain thereof is coupled to the source of the transistor MN5. The source thereof is grounded. The gate of the transistor MN8 is supplied with the signal RLAT from the control circuit 9. The drain thereof is coupled to the source of the transistor MN6. The source thereof is grounded.

The buffer 32 is configured so as to output, as the signal SD, a result of latching by the latch circuit 31. The input terminal of the buffer 32 is coupled to the node N1, and the output terminal thereof is coupled to the control circuit 9.

With this configuration, the transistor MP3 of the sense amplifier 30A causes a current corresponding to the control voltage Vclamp to flow from the power supply node of the power supply voltage VDD through the transistor MP1, the transfer gate 16A, and the transistor 15A toward the memory cell array 10A. This similarly applies to the transistors MP3 of the sense amplifiers 30B to 30D. In addition, the transistors MP4 of the sense amplifiers 30A to 30D cause a current corresponding to the control voltage Vclamp to flow from the power supply node of the power supply voltage VDD through the four transistors MP2, the transfer gates 26A to 26D, and the transistors 25A to 25D toward the memory cell arrays 20A to 20D.

In addition, in each of the sense amplifiers 30A to 30D, the latch circuit 31 performs the latch operation on the basis of the voltage at the node N1 and the voltage at the node N2. Specifically, the latch circuit 31 is configured such that, upon turning of the signal RLAT into the high level, the transistors MN7 and MN8 turn into the ON state, and the sources of the transistors MN5 and MN6 are grounded. The transistors MN5 and MN6 perform a full feedback operation on the basis of the voltage at the node N1 and the voltage at the node N2. For example, in a case where the voltage at the node N1 is higher than the voltage at the node N2, the full feedback operation is performed to set the voltage at the node N1 to the high level and set the voltage at the node N2 to the low level. In addition, in a case where the voltage at the node N1 is lower than the voltage at the node N2, the full feedback operation is performed to set the voltage at the node N1 to the low level and set the voltage at the node N2 to the high level. Furthermore, the buffer 32 is configured to output, as the signal SD, a result of latching by the latch circuit 31.

In the reading-out operation, the control voltage generating circuit 40 is configured so as to generate the control voltage Vclamp on the basis of an instruction from the control circuit 9, and supply this control voltage Vclamp to the sense amplifiers 30A to 30D.

The control voltage generating circuit 40 includes a voltage generating circuit 51, an operational amplifier 52, a switch 53, a transistor 41, a memory element 42, a transistor 43, a transfer gate 44, a transistor 45, a transfer gate 46, and transistors 47 and 48, as illustrated in FIG. 3. The transistor 41, the memory element 42, the transistor 43, the transfer gate 44, the transistor 45, the transfer gate 46, and the transistors 47 and 48 are configured as replicas of individual elements in a path extending from the memory cell arrays 10 and 20 to the sense amplifier 30, as illustrated in FIG. 3. The transistors 41, 43, and 45 are N-type MOS transistors, and the transistors 47 and 48 are P-type MOS transistors.

The voltage generating circuit 51 is configured so as to generate a voltage VREF.

The operational amplifier 52 is configured so as to amplify a difference in voltage between a voltage at the positive input terminal and a voltage at the negative input terminal to generate the voltage Vclamp, and output this voltage Vclamp from the output terminal. The output terminal of the operational amplifier 52 is coupled to the switch 53, the gate of the transistor 48, and the gates of the transistors MP3 and MP4 of each of the sense amplifiers 30A to 30D.

The switch 53 includes one end coupled to the power supply node of the power supply voltage VDD, and the other end coupled to the output terminal of the operational amplifier 52. In this manner, the switch 53 is configured to turn on and off on the basis of a control signal supplied from the control circuit 9.

The gate of the transistor 41 is coupled to the power supply node of the power supply voltage VDD. The drain thereof is coupled to the memory element 42, and the source thereof is grounded. The transistor 41 is set to the ON state. The transistor 41 has the same property as the transistors 111 to 114 in the memory cell arrays 10 and 20.

The memory element 42 includes one end coupled to the source of the transistor 43 and the positive input terminal of the operational amplifier 52, and the other end coupled to the drain of the transistor 41. The memory element 42 has the same property as the memory element 102 in the memory cell arrays 10 and 20. The resistance state of the memory element 42 is set to the low-resistance state RL.

The gate of the transistor 43 is coupled to the power supply node of the power supply voltage VDD. The drain thereof is coupled to the transfer gate 44. The source thereof is coupled to one end of the memory element 42 and the positive input terminal of the operational amplifier 52. The transistor 43 is set to the ON state. The transistor 43 has the same property as the transistor 101 in the memory cell arrays 10 and 20.

The transfer gate 44 includes one end coupled to the source of the transistor 45, and the other end coupled to the drain of the transistor 43. The transfer gate 44 is set to the ON state. The transfer gate 44 has the same property as the transfer gates 11 to 14 in the memory cell arrays 10 and 20.

The gate of the transistor 45 is coupled to the power supply node of the power supply voltage VDD. The drain thereof is coupled to the transfer gate 46. The source thereof is coupled to one end of the transfer gate 44. The transistor 45 is set to the ON state. The transistor 45 has the same property as the transistors 15 and 25.

The transfer gate 46 includes one end coupled to the gate and the drain of the transistor 47, and the other end coupled to the drain of the transistor 45. The transfer gate 46 is set to the ON state. The transfer gate 46 has the same property as the transfer gates 16 and 26.

The gate and the drain of the transistor 47 are coupled to one end of the transfer gate 46, and the source thereof is coupled to the drain of the transistor 48. The transistor 47 has the same property as the transistors MP1 and MP2 in the sense amplifier 30.

The gate of the transistor 48 is coupled to the output terminal of the operational amplifier 52. The drain thereof is coupled to the source of the transistor 47. The source thereof is coupled to the power supply node of the power supply voltage VDD. The transistor 48 has the same property as the transistors MP3 and MP4. The transistor 48 and the transistors MP3 and MP4 in the sense amplifiers 30A to 30D constitute a current mirror circuit.

With this configuration, in the control voltage generating circuit 40, upon turning of the switch 53 into the OFF state, a negative feedback operation is performed to cause a voltage at one end of the memory element 42 to be at the voltage VREF. This causes the control voltage generating circuit 40 to generate the control voltage Vclamp. In this negative feedback operation, the voltage at one end of the memory element 42 turns into a voltage equivalent to the voltage VREF, and a current corresponding to this voltage VREF flows from one end of the memory element 42 toward the other end. The voltage VREF is set such that the electric current value of the current flowing through the memory element 42 is lower than the current threshold value TH at which the resistance state changes. The control voltage Vclamp generated by the control voltage generating circuit 40 is supplied to the gates of the transistors MP3 and MP4 of the sense amplifier 30. The transistor 48 and the transistors MP3 and MP4 in the sense amplifiers 30A to 30D constitute a current mirror circuit. In addition, individual elements of the control voltage generating circuit 40 that exist from the transistor 41 to the transistor 48 are replicas of individual elements in a path extending from the memory cell arrays 10 and 20 to the sense amplifier 30. Thus, a current flowing through the memory element 102 is lower than the current threshold value TH at which the resistance state changes, as with the current flowing through the memory element 42. With this configuration, in the reading-out operation, the semiconductor circuit 1 makes it possible to prevent a change of the resistance state of the memory element 102 in a memory cell MC selected in the memory cell arrays 10 and 20.

Here, the memory element 102 in the memory cell array 10A corresponds to one specific example of a "first memory element" in the present disclosure. The bit line BL in the memory cell array 10A corresponds to one specific example of a "first signal line" in the present disclosure. The memory element 102 in the memory cell array 20A corresponds to one specific example of a "second memory element" in the present disclosure. The bit line BL in the memory cell array 20A corresponds to one specific example of a "second signal line" in the present disclosure. The sense amplifier 30A corresponds to one specific example of a "sense amplifier" in the present disclosure. The latch circuit 31 corresponds to one specific example of a "latch circuit" in the present disclosure. The transistor MN5 corresponds to one specific example of a "fifth transistor" in the present disclosure. The transistor MN6 corresponds to one specific example of a "sixth transistor" in the present disclosure. The transistor MP1 corresponds to one specific example of a "first transistor" in the present disclosure. The transistor MP2 corresponds to one specific example of a "second transistor" in the present disclosure. The transistor MP3 corresponds to one specific example of a "third transistor" in the present disclosure. The transistor MP4 corresponds to one specific example of a "fourth transistor" in the present disclosure. For example, the transfer gate 16A corresponds to one specific example of a "first switch" in the present disclosure. For example, the transfer gate 26A corresponds to one specific example of a "second switch" in the present disclosure. The control voltage generating circuit 40 corresponds to one specific example of a "control voltage generating circuit" in the present disclosure. The control voltage Vclamp corresponds to one specific example of a "control voltage" in the present disclosure.

Workings and Effects

Next, workings and effects of the semiconductor circuit 1 according to the present embodiment will be described.

Outline of Entire Operation

First, the outline of the entire operations of the semiconductor circuit 1 will be described with reference to FIGS. 1 to 3. The memory cell arrays 10A, 10B, 10C, and 10D hold data. The memory cell arrays 20A, 20B, 20C, and 20D hold reference data serving as predetermined data. In the reading-out operation, the sense amplifier 30A compares the voltage at the terminal TD and the voltage at the terminal TR with each other to read out the data held in the memory cell array 10A, and supplies the control circuit 9 with the signal SD indicating the result of reading-out. In the reading-out operation, the sense amplifier 30B compares the voltage at the terminal TD and the voltage at the terminal TR with each other to read out the data held in the memory cell array 10B, and supplies the control circuit 9 with the signal SD indicating the result of reading-out. In the reading-out operation, the sense amplifier 30C compares the voltage at the terminal TD and the voltage at the terminal TR with each other to read out the data held in the memory cell array 10C, and supplies the control circuit 9 with the signal SD indicating the result of reading-out. In the reading-out operation, the sense amplifier 30D compares the voltage at the terminal TD and the voltage at the terminal TR with each other to read out the data held in the memory cell array 10D, and supplies the control circuit 9 with the signal SD indicating the result of reading-out. The control circuit 9 controls the operation of the semiconductor circuit 1 so as to write data on the four memory cell arrays 10 on the basis of the writing command and the writing data supplied from the outside. In addition, the control circuit 9 controls the operation of the semiconductor circuit 1 so as to read the data from the four memory cell arrays 10 on the basis of the reading-out command supplied from the outside.

About Reading-Out Operation

FIG. 4 is a diagram illustrating one example of the reading-out operation in the semiconductor circuit 1.

First, the semiconductor circuit 1 supplies the control voltage Vclamp to the sense amplifiers 30A to 30D (step S101). Specifically, in the control voltage generating circuit 40, the switch 53 changes from the ON state into the OFF state on the basis of an instruction from the control circuit 9. With this operation, the control voltage generating circuit 40 performs the negative feedback operation to generate the control voltage Vclamp. In addition, the control voltage generating circuit 40 supplies this control voltage Vclamp to the sense amplifiers 30A to 30D.

Next, in each of the memory cell arrays 10A to 10D and 20A to 20D, the semiconductor circuit 1 selects a memory cell MC serving as a target of reading-out (step S102). Specifically, the control circuit 9 supplies the transistors 15A to 15D with a control signal to turn the transistors 15A to 15D into the ON state. In addition, the control circuit 9 supplies a control signal to the transfer gates 11 to 14 in the memory cell arrays 10A to 10D on the basis of an address signal contained in the reading-out command, thereby turning one of the transfer gates 11 to 14 into the ON state. For example, in a case of turning the transfer gate 11 into the ON state, the control circuit 9 turns the four transfer gates 11 in the memory cell arrays 10A to 10D into the ON state. Furthermore, the control circuit 9 supplies a control signal to the transistors 111 to 114 in the memory cell arrays 10A to 10D to turn, into the ON state, a transistor corresponding to the transfer gate to be turned into the ON state from among the transfer gates 11 to 14. Specifically, the control circuit 9: turns the transistor 111 into the ON state in a case of turning the transfer gate 11 into the ON state; turns the transistor 112 into the ON state in a case of turning the transfer gate 12 into the ON state; turns the transistor 113 into the ON state in a case of turning the transfer gate 13 into the ON state; and turns the transistor 114 into the ON state in a case of turning the transfer gate 14 into the ON state. For example, in a case of turning the transistor 111 into the ON state, the control circuit 9 turns the four transistors 111 in the memory cell arrays 10A to 10D into the ON state. In addition, the control circuit 9 turns, into the high level, the voltage of one line of the plurality of word lines WL in the memory cell arrays 10A to 10D on the basis of an address signal contained in the reading-out command. Through the operations, the control circuit 9 selects one of the plurality of memory cells MC in the memory cell arrays 10A to 10D.

Similarly, the control circuit 9 supplies a control signal to the transistors 25A to 25D to turn the transistors 25A to 25D into the ON state. Furthermore, as for the control circuit 9, the control circuit 9 supplies a control signal to the transfer gates 11 to 14 in the memory cell arrays 20A to 20D to turn one of the transfer gates 11 to 14 into the ON state. For example, in a case of turning the transfer gate 11 into the ON state, the control circuit 9 turns the four transfer gates 11 in the memory cell arrays 20A to 20D into the ON state. In addition, the control circuit 9 supplies a control signal to the transistors 111 to 114 in the memory cell arrays 20A to 20D to turn, into the ON state, a transistor corresponding to the transfer gate to be turned into the ON state, from among the transfer gates 11 to 14. Specifically, the control circuit 9: turns the transistor 111 into the ON state in a case of turning the transfer gate 11 into the ON state; turns the transistor 112 into the ON state in a case of turning the transfer gate 12 into the ON state; turns the transistor 113 into the ON state in a case of turning the transfer gate 13 into the ON state; and turns the transistor 114 into the ON state in a case of turning the transfer gate 14 into the ON state. For example, in a case of turning the transistor 111 into the ON state, the control circuit 9 turns the four transistors 111 in the memory cell arrays 20A to 20D into the ON state. Furthermore, the control circuit 9 turns, into the high level, a voltage of one line of the plurality of word lines WL in the memory cell arrays 20A to 20D. Through the operations, the control circuit 9 selects one cell of the plurality of memory cells MC in each of the memory cell arrays 20A to 20D.

Next, the semiconductor circuit 1 turns the transfer gates 16A to 16D and 26A to 26D into the ON state (step S103). Specifically, the control circuit 9 supplies a control signal to the transfer gates 16A to 16D and 26A to 26D to change the transfer gates 16A to 16D and 26A to 26D from the OFF state into the ON state. With this configuration, the memory cell MC selected in the memory cell array 10A is coupled to the terminal TD of the sense amplifier 30A through the transistor 15A and the transfer gate 16A. The memory cell MC selected in the memory cell array 10B is coupled to the terminal TD of the sense amplifier 30B through the transistor 15B and the transfer gate 16B. The memory cell MC selected in the memory cell array 10C is coupled to the terminal TD of the sense amplifier 30C through the transistor 15C and the transfer gate 16C. The memory cell MC selected in the memory cell array 10D is coupled to the terminal TD of the sense amplifier 30D through the transistor 15D and the transfer gate 16D. Furthermore, the memory cell MC selected in the memory cell array 20A, the memory cell MC selected in the memory cell array 20B, the memory cell MC selected in the memory cell array 20C, and the memory cell MC selected in the memory cell array 20D are coupled to the terminals TR of the sense amplifiers 30A, 30B, 30C, and 30D through the nodes NR.

With this configuration, for example, the transistor MP3 of the sense amplifier 30A causes a current corresponding to the control voltage Vclamp to flow from the power supply node of the power supply voltage VDD through the transistor MP1, the transfer gate 16A, and the transistor 15A toward the memory cell array 10A. Thus, the voltage at the node N1 turns to be a voltage corresponding to the resistance state of the memory element 102 in the selected memory cell MC of the memory cell array 10A. This similarly applies to the transistors MP3 of the sense amplifiers 30B to 30D.

In addition, the transistors MP4 of the sense amplifiers 30A to 30D cause a current corresponding to the control voltage Vclamp to flow from the power supply node of the power supply voltage VDD through the four transistors MP2, the transfer gates 26A to 26D, and the transistors 25A to 25D toward the memory cell arrays 20A to 20D. In the memory cell arrays 20A to 20D that hold the reference data, four memory elements 102 of the selected four memory cells MC include two memory elements 102 of which resistance state is the low-resistance state RL, and include two memory elements 102 of which resistance state is the high-resistance state RH. Thus, the voltage at the node N2 in the sense amplifiers 30A to 30D turns into a voltage corresponding to the average value of resistance values of these four memory elements 102. In other words, the voltage at the node N2 falls into a voltage between the voltage corresponding to the low-resistance state RL and the voltage corresponding to the high-resistance state RH.

Thus, for example, in a case where the resistance state of the memory element 102 of the selected memory cell MC in the memory cell array 10A is the low-resistance state RL, the voltage at the node N1 is lower than the voltage at the node N2 in the sense amplifier 30A. In addition, for example, in a case where the resistance state of the memory element 102 of the selected memory cell MC in the memory cell array 10A is the high-resistance state RH, the voltage at the node N1 is higher than the voltage at the node N2 in the sense amplifier 30A. This similarly applies to the sense amplifiers 30B to 30D.

Next, the semiconductor circuit 1 turns the transfer gates 16A to 16D and 26A to 26D into the OFF state (step S104). Specifically, the control circuit 9 supplies a control signal to the transfer gates 16A to 16D and 26A to 26D to turn the transfer gates 16A to 16D and 26A to 26D into the OFF state. With this configuration, the selected memory cell MC in the memory cell array 10A is cut off from the terminal TD of the sense amplifier 30A. The selected memory cell MC in the memory cell array 10B is cut off from the terminal TD of the sense amplifier 30B. The selected memory cell MC in the memory cell array 10C is cut off from the terminal TD of the sense amplifier 30C. The selected memory cell MC in the memory cell array 10D is cut off from the terminal TD of the sense amplifier 30D. Furthermore, the memory cell MC selected in the memory cell array 20A, the memory cell MC selected in the memory cell array 20B, the memory cell MC selected in the memory cell array 20C, the memory cell MC selected in the memory cell array 20D are cut off from the terminal TR of the sense amplifiers 30A, 30B, 30C, and 30D.

After the transfer gates 16A to 16D and 26A to 26D turn into the OFF state, the transistor MP3 in each of the sense amplifiers 30A to 30D causes a current corresponding to the control voltage Vclamp to flow from the power supply node of the power supply voltage VDD through the transistor MP1 toward the node N1. Similarly, the transistor MP4 in the sense amplifier 30A causes a current corresponding to the control voltage Vclamp to flow from the power supply node of the power supply voltage VDD through the transistor MP2 to the node N2. With this configuration, in each of the sense amplifiers 30A to 30D, the voltages at the nodes N1 and N2 rise while maintaining the high-low relationship between the voltage at the node N1 and the voltage at the node N2. Then, the voltages at the nodes N1 and N2 reach a higher voltage that enables the latch circuit 31 including the N-type MOS transistor to perform the latch operation.

Next, the semiconductor circuit 1 performs the latch operation (step S105). Specifically, the control circuit 9 causes the signal RLAT to change from the low level into the high level. This causes the transistors MN7 and MN8 to turn into the ON state in each of the sense amplifiers 30A to 30D, and causes the sources of the transistors MN5 and MN6 to be grounded. The transistors MN5 and MN6 perform the full feedback operation on the basis of the voltage at the node N1 and the voltage at the node N2. For example, in a case where the voltage at the node N1 is higher than the voltage at the node N2, the full feedback operation is performed to turn the voltage at the node N1 into the high level and turn the voltage at the node N2 into the low level. In addition, in a case where the voltage at the node N1 is lower than the voltage at the node N2, the full feedback operation is performed to turn the voltage at the node N1 into the low level and turn the voltage at the node N2 into the high level. Then, the buffer 32 outputs, as the signal SD, the result of latching by the latch circuit 31. The control circuit 9 generates reading-out data corresponding to the reading-out command on the basis of the signal SD supplied from the sense amplifiers 30A to 30D, and outputs the reading-out data.

Then, this flow ends.

In this manner, the semiconductor circuit 1 is configured such that the transistors MP3 and MP4 cause a current corresponding to the control voltage Vclamp to flow in each of the sense amplifiers 30A to 30D. With this configuration, for example, in a case where the number of sense amplifiers 30 is large, it is possible to cause a current corresponding to the control voltage Vclamp to stably flow immediately after the transfer gates 16A and 26A are changed from the OFF state into the ON state. This makes it possible to perform a high-speed reading-out operation in which a large volume of data are read out in a short period of time.

Comparative Example

Next, workings and effects of the present embodiment will be described by making a comparison with a comparative example. The present comparative example differs from the present embodiment in the method of causing a current to flow through the selected memory cell MC in the reading-out operation.

FIG. 5 is a diagram illustrating a portion of circuits of the memory cell arrays 10A and 20A in a semiconductor circuit 1R according to a comparative example. The semiconductor circuit 1R includes the memory cell arrays 10A and 20A, the transistors 15A and 25A, transistors MN101 and MN102, the transfer gates 16A and 26A, a sense amplifier 30RA, and a control voltage generating circuit 40R.

The transistors MN101 and MN102 are N-type MOS transistors. The gate of the transistor MN101 is supplied with a control voltage Vclampr. The drain thereof is coupled to the other end of the transfer gate 16A. The source thereof is coupled to the drain of the transistor 15A. The gate of the transistor MN102 is supplied with a control voltage Vclampr. The drain thereof is coupled to the other end of the transfer gate 26A. The source thereof is coupled to the node NR.

The sense amplifier 30RA includes the transistors MP1 and MP2, the latch circuit 31, and the buffer 32. That is, the sense amplifier 30RA is configured such that the transistor MP3 or MP4 is not provided in the sense amplifier 30 (FIG. 3) according to the present embodiment.

In the reading-out operation, the control voltage generating circuit 40R is configured so as to generate the control voltage Vclampr, and supply this control voltage Vclampr to the sense amplifier 30RA.

As with the case of the semiconductor circuit 1 according to the present embodiment (FIG. 4), the semiconductor circuit 1R supplies the control voltage Vclampr to the sense amplifier 30RA (step S101), selects a memory cell MC (step S102), and turns the transfer gates 16A to 16D and 26A to 26D into the ON state (step S103). As the transfer gates 16A to 16D and 26A to 26D change from the OFF state into the ON state in this manner, a current starts to flow through the transistors MN101 and MN102. This causes the source voltage of the transistors MN101 and MN102 to rapidly change. The rapid change in the source voltage of the transistors MN101 and MN102 may cause the control voltage Vclampr to fluctuate through the capacitance between the gate and the source of the transistors MN101 and MN102. The control voltage Vclampr transiently changes at timing when a current starts to depart to the transistors MN101 and MN102, and then, converges at a desired voltage after a certain period of time elapses. In particular, four sense amplifiers are coupled in this example, for the purpose of convenience of explanation. In a case where the number of sense amplifiers is more than this, the control voltage Vclampr may more largely fluctuate. In a case of the semiconductor circuit 1R, the next operation is performed after the control voltage Vclampr has converged at a desired voltage, in order to achieve stable operations. Thus, the semiconductor circuit 1R needs to wait until the control voltage Vclampr has converges, which makes it impossible to immediately read out the data. In this case, with the semiconductor circuit 1R, it is difficult to read out a large amount of data in a short period of time. In addition, with the semiconductor circuit 1R, the circuit area increases in a case where a capacitive element used for decoupling is coupled to the gate of the transistors MN101 and MN102 in order to suppress the fluctuation of the control voltage Vclampr, for example.

In contrast, the semiconductor circuit 1 according to the present embodiment is configured such that the transistors MP3 and MP4 cause a current corresponding to the control voltage Vclamp to flow. This configuration enables the semiconductor circuit 1 to reduce the possibility that the control voltage Vclamp fluctuates immediately after the transfer gates 16A to 16D and 26A to 26D change from the OFF state into the ON state in step S103. That is, with the semiconductor circuit 1, it is possible to suppress the fluctuation of the control voltage Vclamp without providing any capacitive element used for decoupling described above. Thus, the semiconductor circuit 1 makes it possible to cause a current corresponding to the control voltage Vclamp to stably flow after the transfer gates 16A to 16D and 26A to 26D change from the OFF state into the ON state, which makes it possible to immediately perform the next operation. This enables the semiconductor circuit 1 to perform the high-speed reading-out operation in which a large volume of data are read out in a short period of time.

In this manner, the semiconductor circuit 1 includes the sense amplifier 30, the first switch (transfer gate 16A), and the second switch (transfer gate 26A). The sense amplifier 30 includes: the latch circuit 31 applying, to a second node (node N2), a voltage inverted with respect to the voltage at a first node (node N1) and applying, to the first node (node N1), a voltage inverted with respect to the voltage at the second node (node N2); and the first to fourth transistors (transistors MP1 to MP4). The first transistor (transistor MP1) includes a source, and includes a gate and a drain that are coupled to the first node (node N1). The second transistor (transistor MP2) includes a source, and includes a gate and a drain that are coupled to the second node (node N2). The third transistor (transistor MP3) includes: a source coupled to the power supply node; a gate to which the control voltage Vclamp is applied; and a drain coupled to the source of the first transistor (transistor MP1). The fourth transistor (transistor MP4) includes: a source coupled to the power supply node; a gate to which the control voltage Vclamp is applied; and a drain coupled to the source of the second transistor (transistor MP2). The first switch (transfer gate 16A) is configured to couple the first signal line (the bit line BL in the memory cell array 10A) and the first node (node N1) to each other by turning into the ON state. The second switch (transfer gate 26A) is configured to couple the second signal line (the bit line BL in the memory cell array 20A) and the second node (node N2) to each other by turning into the ON state. This configuration enables the semiconductor circuit 1 to immediately perform the next operation after the transfer gates 16A to 16D and 26A to 26D turn from the OFF state into the ON state. Thus, with the semiconductor circuit 1, it is possible to perform the high-speed reading-out operation in which a large volume of data are read out in a short period of time.

Effects

As described above, the present embodiment is configured to include the sense amplifier, the first switch, and the second switch. The sense amplifier includes the latch circuit configured to apply, to the second node, a voltage inverted with respect to the voltage at the first node, and apply, to the first node, a voltage inverted with respect to a voltage at the second node, and includes the first to fourth transistors. The first transistor includes the source, and includes the gate and the drain that are coupled to the first node. The second transistor includes the source, and includes the gate and the drain that are coupled to the second node. The third transistor includes the source coupled to the power supply node, the gate to which the control voltage is applied, and the drain coupled to the source of the first transistor. The fourth transistor includes the source coupled to the power supply node, the gate to which the control voltage is applied, and the drain coupled to the source of the second transistor. The first switch is configured to couple the first signal line and the first node to each other by turning into the ON state. The second switch is configured to couple the second signal line and the second node to each other by turning into the ON state. This configuration makes it possible to perform the high-speed reading-out operation in which a large volume of data are read out in a short period of time.

First Modification Example

The embodiment described above employs the N-type MOS transistor to configure the latch circuit 31. However, the configuration is not limited to this. Instead, a P-type MOS transistor may be employed to configure the latch circuit 31, for example. The present modification example will be described in detail below.

FIG. 6 is a diagram illustrating one configuration example of the sense amplifier 30A according to the present modification example. This similarly applies to the sense amplifiers 30B to 30D. The latch circuit 31 includes transistors MP15 to MP18. The transistors MP15 to MP18 are P-type MOS transistors. The gate of the transistor MP15 is coupled to the node N2. The drain thereof is coupled to the node N1. The source thereof is coupled to the drain of the transistor MP17. The gate of the transistor MP16 is coupled to the node N1. The drain thereof is coupled to the node N2. The source thereof is coupled to the drain of the transistor MP18. The gate of the transistor MP17 is supplied with a signal RLATB from the control circuit 9 according to the present modification example. The drain thereof is coupled to the source of the transistor MP15. The source thereof is coupled to the power supply node of the power supply voltage VDD. The gate of the transistor MP18 is supplied with the signal RLATB from the control circuit 9 according to the present modification example. The drain thereof is coupled to the source of the transistor MP16. The source thereof is coupled to the power supply node of the power supply voltage VDD. This similarly applies to the sense amplifiers 30B to 30D. Here, the transistor MP15 corresponds to one specific example of a "fifth transistor" in the present disclosure. The transistor MP16 corresponds to one specific example of a "sixth transistor" in the present disclosure.

FIG. 7 is a diagram illustrating one example of a reading-out operation of the semiconductor circuit 1 according to the present modification example.

As with the embodiment described above (FIG. 4), the semiconductor circuit 1 first supplies the control voltage Vclamp to the sense amplifiers 30A to 30D (step S101), selects a memory cell MC in each of the memory cell arrays 10A to 10D and 20A to 20D (step S102), and turns the transfer gates 16A to 16D and 26A to 26D into the ON state (step S103). With this configuration, for example, in a case where the resistance state of the memory element 102 of the selected memory cell MC in the memory cell array 10A is the low-resistance state RL, the voltage at the node N1 is lower than the voltage at the node N2 in the sense amplifier 30A, as with the embodiment described above (FIG. 4). In addition, for example, in a case where the resistance state of the memory element 102 of the selected memory cell MC in the memory cell array 10A is the high-resistance state RH, the voltage at the node N1 is higher than the voltage at the node N2 in the sense amplifier 30A. The voltages of the nodes N1 and N2 are lower voltages that enable the latch circuit 31 including the P-type MOS transistor to perform the latch operation. This similarly applies to the sense amplifiers 30B to 30D.

Next, the semiconductor circuit 1 performs the latch operation (step S114). Specifically, the control circuit 9 changes the signal RLATB from the high level into the low level. In each of the sense amplifiers 30A to 30D, the transistors MP17 and MP18 are turned into the ON state, and the power supply voltage VDD is applied to the source of the transistors MP15 and MP16. The transistors MP15 and MP16 perform the full feedback operation on the basis of the voltage at the node N1 and the voltage at the node N2. For example, in a case where the voltage at the node N1 is higher than the voltage at the node N2, the full feedback operation is performed to set the voltage at the node N1 to the high level and set the voltage at the node N2 to the low level. In addition, in a case where the voltage at the node N1 is lower than the voltage at the node N2, the full feedback operation is performed to set the voltage at the node N1 to the low level and set the voltage at the node N2 to the high level.

Furthermore, the buffer 32 outputs the result of latching by the latch circuit 31 as the signal SD.

In addition, the semiconductor circuit 1 turns the transfer gates 16A to 16D and 26A to 26D into the OFF state (step S115), as with the embodiment described above (FIG. 4).

Then, this flow ends.

Second Modification Example

Figure 8:
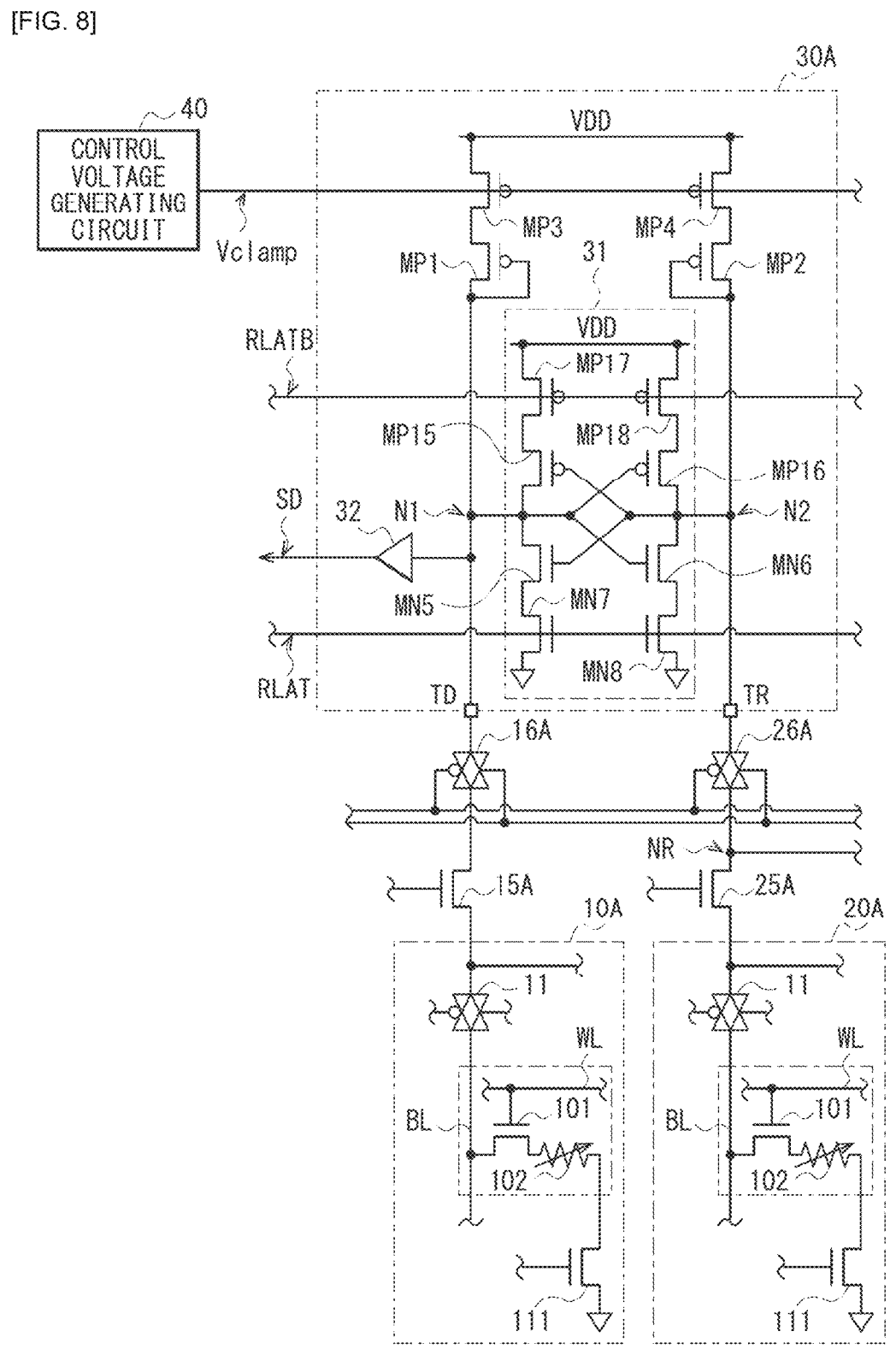

The embodiment described above employs one conductivity-type MOS transistor to configure the latch circuit 31. However, the configuration is not limited to this. Instead, an N-type MOS transistor and a P-type MOS transistor may be employed to configure the latch circuit 31, for example, as illustrated in FIG. 8. This latch circuit 31 includes the transistors MN5 to MN8 and MP15 to MP18. The transistors MN5 to MN8 are N-type MOS transistors, and the transistors MP15 to MP18 are P-type MOS transistors. This latch circuit 31 is configured by combining the latch circuit 31 (FIG. 3) according to the embodiment described above and the latch circuit 31 (FIG. 6) according to the first modification example, and is a latch circuit having a CMOS (Complementary MOS) configuration. Here, the transistor MN5 corresponds to one specific example of a "fifth transistor" in the present disclosure. The transistor MN6 corresponds to one specific example of a "sixth transistor" in the present disclosure. The transistor MP15 corresponds to one specific example of a "seventh transistor" in the present disclosure. The transistor MP16 corresponds to one specific example of an "eighth transistor" in the present disclosure.

Third Modification Example

The embodiment described above is configured such that, in the sense amplifiers 30A to 30D, the sources of the transistors MP3 and MP4 are coupled directly to the power supply node of the power supply voltage VDD. However, the configuration is not limited to this. Instead, it may be possible to employ a configuration in which the source of the transistor MP3 is coupled to the power supply node through a transistor, and the source of the transistor MP4 is coupled to the power supply node through a transistor, for example, as illustrated in FIG. 9. The sense amplifier 30A includes transistors MP11 and MP12. The transistors MP11 and MP12 are P-type MOS transistors. The gate of the transistor MP11 is supplied with a signal PG from the control circuit 9 according to the present modification example. The source thereof is coupled to the power supply node of the power supply voltage VDD. The drain thereof is coupled to the source of the transistor MP3. The gate of the transistor MP12 is supplied with the signal PG from the control circuit 9 according to the present modification example. The source thereof is coupled to the power supply node of the power supply voltage VDD. The drain thereof is coupled to the source of the transistor MP4. Here, the transistor MP11 corresponds to one specific example of a "first power supply transistor" in the present disclosure. The transistor MP12 corresponds to one specific example of a "second power supply transistor" in the present disclosure. In a case of operating the sense amplifier 30A, the control circuit 9 according to the present modification example turns the signal PG into the low level. This causes the transistors MP11 and MP12 to turn into the ON state, and the semiconductor circuit 1 operates in a manner similar to the embodiment described above. In addition, in a case where the sense amplifier 30A is not operated, the control circuit 9 turns the signal PG into the high level. This causes the transistors MP11 and MP12 to turn into the OFF state. In this manner, by providing the transistors MP11 and MP12 used to achieve power gating, it is possible to effectively reduce the power consumption.

Fourth Modification Example

The embodiment described above is configured such that, in the sense amplifiers 30A to 30D, the drain of the transistor MP3 is coupled to the source of the transistor MP1, and the drain of the transistor MP4 is coupled to the source of the transistor MP2. However, the configuration is not limited to this. Instead, it may be possible to employ a configuration in which the drains of the transistors MP3 and MP4 and the sources of the transistors MP1 and MP2 are coupled to each other, for example, as illustrated in FIG. 10. The transistors MP3 and MP4 of the sense amplifier 30A cause a current corresponding to the control voltage Vclamp to flow from the power supply node of the power supply voltage VDD through the transistors MP1 and MP2, the transfer gates 16A and 26A, and the transistors 15A and 25A to 25D toward the memory cell arrays 10A and 20A to 20D. This similarly applies to the sense amplifiers 30B to 30D. With this configuration, even in a case where the property of the transistor MP3 and the property of the transistor MP4 slightly differ from each other due to a so-called mismatch, it is possible to suppress the influence thereof, for example.

Fifth Modification Example

The embodiment described above is configured such that, in the sense amplifiers 30A to 30D, two transistors MP3 and MP4 are provided. However, the configuration is not limited to this. Instead, one transistor MP13 may be provided, for example, as illustrated in FIG. 11. This transistor MP13 is a P-type MOS transistor. The gate thereof is supplied with the control voltage Vclamp. The source thereof is coupled to the power supply node of the power supply voltage VDD. The drain thereof is coupled to the sources of the transistors MP1 and MP2. Here, the transistor MP13 corresponds to one specific example of a "third transistor" in the present disclosure. The transistor MP13 of the sense amplifier 30A causes a current corresponding to the control voltage Vclamp to flow from the power supply node of the power supply voltage VDD through the transistors MP1 and MP2, the transfer gates 16A and 26A, and the transistors 15A and 25A to 25D toward the memory cell arrays 10A and 20A to 20D. Thus, the current flowing through the memory element 102 is lower than the current threshold value TH at which the resistance state changes. This similarly applies to the sense amplifiers 30B to 30D.

Sixth Modification Example

In the embodiment described above, two transistors MP3 and MP4 in the sense amplifiers 30A to 30D may each include a plurality of transistors (three transistors in this example) coupled in parallel as illustrated in FIG. 12. In addition, the present modification example may be applied to the technique according to the third modification example, as illustrated in FIG. 13. In this example, two transistors MP11 and MP12 also each include a plurality of transistors (three in this example) coupled in parallel.

Seventh Modification Example

The embodiment described above is configured such that the control voltage Vclamp is supplied to the sense amplifiers 30A to 30D, and then, the transfer gates 16A to 16D and 26A to 26D are turned into the ON state, as illustrated in FIG. 4. However, the voltages at the nodes N1 and N2 may be set before the transfer gates 16A to 16D and 26A to 26D are turned into the ON state. Below, detailed description will be made by giving some examples.

FIG. 14 is a diagram illustrating one configuration example of a sense amplifier 30A according to the present modification example. The sense amplifier 30A includes a transfer gate 33. The transfer gate 33 includes one end coupled to the node N1 and the other end coupled the node N2. The transfer gate 33 is configured so as to turn on and off on the basis of a control signal from the control circuit 9 according to the present modification example. Here, the transfer gate 33 corresponds to one specific example of a "voltage setting section" and a "third switch" in the present disclosure.

FIG. 15 is a diagram illustrating one operation example of the semiconductor circuit 1 including the sense amplifier 30A illustrated in FIG. 14.

First, the semiconductor circuit 1 supplies the control voltage Vclamp to the sense amplifiers 30A to 30D (step S101), as with the embodiment described above (FIG. 4).

Next, the semiconductor circuit 1 turns the transfer gate 33 into the ON state to perform an equalizing operation (step S121). Specifically, the control circuit 9 supplies a control signal to the transfer gate 33 to turn the transfer gate 33 into the ON state. With this configuration, the node N1 and the node N2 are electrically coupled to each other, which makes the voltage at the node N1 and the voltage at the node N2 equal to each other.

Then, the semiconductor circuit 1 turns the transfer gate 33 into the OFF state (step S122).

Next, in each of the memory cell arrays 10A to 10D and 20A to 20D, the semiconductor circuit 1 selects a memory cell MC serving as the target of reading-out (step S102), turns the transfer gates 16A to 16D and 26A to 26D into the ON state (step S103), turns the transfer gates 16A to 16D and 26A to 26D into the OFF state (step S104), and performs the latch operation (step S105), as with the embodiment described above (FIG. 4).

FIG. 16 is a diagram illustrating one configuration example of another sense amplifier 30A according to the present modification example. This sense amplifier 30A includes transfer gates 34 and 35. The transfer gate 34 includes one end coupled to the power supply node of the power supply voltage VDD and the other end coupled to the node N1. The transfer gate 34 is configured so as to turn on and off on the basis of a control signal from the control circuit 9 according to the present modification example. The transfer gate 35 includes one end coupled to the power supply node of the power supply voltage VDD and the other end coupled to the node N2. The transfer gate 35 is configured so as to turn on and off on the basis of a control signal from the control circuit 9 according to the present modification example. Here, the transfer gates 34 and 35 each correspond to one specific example of the "voltage setting section" in the present disclosure. The transfer gate 34 corresponds to one specific example of a "fourth switch" in the present disclosure. The transfer gate 35 corresponds to one specific example of a "fifth switch" in the present disclosure.

FIG. 17 is a diagram illustrating one operation example of the semiconductor circuit 1 including the sense amplifier 30A illustrated in FIG. 16.

First, the semiconductor circuit 1 supplies the control voltage Vclamp to the sense amplifiers 30A to 30D (step S101), as with the embodiment described above (FIG. 4).

Next, the semiconductor circuit 1 turns the transfer gates 34 and 35 into the ON state to perform a pre-charge operation (step S131). Specifically, the control circuit 9 supplies a control signal to the transfer gates 34 and 35 to turn the transfer gates 34 and 35 into the ON state. With this configuration, the voltages at the nodes N1 and N2 are set to the power supply voltage VDD.

Next, the semiconductor circuit 1 turns the transfer gates 34 and 35 into the OFF state (step S132).

Next, in each of the memory cell arrays 10A to 10D and 20A to 20D, the semiconductor circuit 1 selects a memory cell MC serving as the target of reading-out (step S102), turns the transfer gates 16A to 16D and 26A to 26D into the ON state (step S103), turns the transfer gates 16A to 16D and 26A to 26D into the OFF state (step S104), and performs the latch operation (step S105), as with the embodiment described above (FIG. 4).

FIG. 18 is a diagram illustrating one configuration example of another sense amplifier 30A according to the present modification example. This sense amplifier 30A includes transfer gates 36 and 37. The transfer gate 36 includes one end coupled to the node N1 and the other end being grounded. The transfer gate 36 is configured so as to turn on and off on the basis of a control signal from the control circuit 9 according to the present modification example. The transfer gate 37 includes one end coupled to the node N2 and the other end being grounded. The transfer gate 37 is configured so as to turn on and off on the basis of a control signal from the control circuit 9 according to the present modification example. Here, the transfer gates 36 and 37 each correspond to one specific example of the "voltage setting section" in the present disclosure. The transfer gate 36 corresponds to one specific example of the "fourth switch" in the present disclosure. The transfer gate 37 corresponds to one specific example of the "fifth switch" in the present disclosure. The semiconductor circuit 1 including this sense amplifier 30A operates in a manner similar to the example in FIG. 17, for example.

Other Modification Examples

In addition, it may be possible to combine two or more modification examples of these modification examples.

These are descriptions of the present technology by giving the embodiment and the modification examples. However, the present technology is not limited to these embodiments or the like, and various modifications are possible.

For example, the embodiment or the like described above is configured such that there are provided four circuit groups including the memory cell arrays 10 and 20, the transistors 15 and 25, the transfer gates 16 and 26, and the sense amplifier 30. However, the configuration is not limited to this. The number of the circuit groups may be more than four.

For example, in the embodiment or the like described above, a magnetic tunneling junction element is used to configure a memory element. However, the configuration is not limited to this. It may be possible to use various types of magnetoresistance change elements. In addition, the configuration is not limited to this. It may be possible to employ any resistance change memory element. Specifically, it may be possible to employ an RRAM memory element or a PCM memory element, for example.

For example, as with a semiconductor circuit 100 illustrated in FIG. 19, it may be possible to include the semiconductor circuit 1, and a processing circuit 90 that performs a predetermined process on the basis of data read out from the semiconductor circuit 1.

Note that the effects described in the present Description are given merely as examples, and are not give for the purpose of limitation. Other effects may be possible.

Note that it may be possible to configure the present technology in the following manner. With the present technology having the following configurations, it is possible to perform the high-speed reading-out operation.

(1)
A semiconductor circuit including:
a first memory cell including a first memory element;
a first signal line coupled to the first memory cell;
a second memory cell including a second memory element;
a second signal line coupled to the second memory cell;
a sense amplifier including:
  a latch circuit configured to apply, to a second node, a voltage inverted with respect to a voltage at a first node, and apply, to the first node, a voltage inverted with respect to a voltage at the second node;
  a first transistor including a source, and including a gate and a drain that are coupled to the first node;
  a second transistor including a source, and including a gate and a drain that are coupled to the second node; and
  a third transistor including a source, a gate to which a control voltage is applicable, and a drain coupled to the source of the first transistor, the source of the second transistor, or both;
a first switch configured to couple the first signal line and the first node to each other by turning into an ON state; and
a second switch configured to couple the second signal line and the second node to each other by turning into an ON state.

(2)
The semiconductor circuit according to (1) described above, in which
the drain of the third transistor is coupled to the source of the first transistor, and
the sense amplifier includes a fourth transistor including:
  a source;
  a gate to which the control voltage is applied; and
  a drain coupled to the source of the second transistor.

(3)
The semiconductor circuit according to (2) described above, further including:
a control voltage generating circuit configured to generate the control voltage, in which
the first memory element and the second memory element are each configured to hold information by using a reversible change of a resistance state, the reversible change corresponding to a direction of a current flowing between both ends, in the case where an electric current value of the current is larger than a predetermined value,
the third transistor is configured to cause a current lower than the predetermined value to flow through the first memory element on the basis of the control voltage, and the fourth transistor is configured to cause a current lower than the predetermined value to flow through the second memory element on the basis of the control voltage.

(4)
The semiconductor circuit according to (2) described above, in which
the drain of the third transistor and the drain of the fourth transistor are coupled to each other.

(5)
The semiconductor circuit according to any one of (2) to (4) described above, in which
the third transistor includes a plurality of transistors coupled in parallel to each other, and
the fourth transistor includes a plurality of transistors coupled in parallel to each other.

(6)
The semiconductor circuit according to any one of (2) to (5) described above, in which
the source of the third transistor and the source of the fourth transistor are coupled to a power supply node.

(7)
The semiconductor circuit according to any one of (2) to (6) described above, in which
the sense amplifier includes:
  a first power supply switch configured to couple a power supply node and the source of the third transistor to each other by turning into an ON state; and
  a second power supply switch configured to couple the power supply node and the source of the fourth transistor to each other by turning into an ON state.

(8)
The semiconductor circuit according to (1) described above, in which
the drain of the third transistor is coupled to the source of the first transistor and the source of the second transistor.

(9)
The semiconductor circuit according to (8) described above, further including:
a control voltage generating circuit configured to generate a control voltage, in which
the first memory element and the second memory element are each configured to hold information by using a reversible change of a resistance state, the reversible change corresponding to a direction of a current flowing between both ends, in the case where an electric current value of the current is larger than a predetermined value, and
the third transistor causes a current lower than the predetermined value to flow through the first memory element and the second memory element on the basis of the control voltage.

(10)
The semiconductor circuit according to any one of (1) to (9) described above, in which
the latch circuit includes:
  a fifth transistor of a first conductivity type, the fifth transistor including:
    a gate coupled to the second node;
    a drain coupled to the first node; and
    a source; and
  a sixth transistor of the first conductivity type, the sixth transistor including:
    a gate coupled to the first node;
    a drain coupled to the second node; and
    a source.

(11)

The semiconductor circuit according to (10) described above, in which the latch circuit further includes:

a seventh transistor of a second conductivity type, the seventh transistor including:

a gate coupled to the second node;

a drain coupled to the first node; and a source; and an eighth transistor of the second conductivity type, the eighth transistor including:

a gate coupled to the first node;

a drain coupled to the second node; and a source.

(12)

The semiconductor circuit according to any one of (1) to (11) described above, further including:

a voltage setting section configured to set a voltage at the first node and a voltage at the second node to be equal to each other.

(13)

The semiconductor circuit according to (12) described above, in which the voltage setting section includes a third switch configured to couple the first node and the second node to each other by turning into an ON state.

(14)

The semiconductor circuit according to (12) described above, in which the voltage setting section includes:

a fourth switch configured to apply a predetermined voltage to the first node by turning into an ON state; and a fifth switch configured to apply the predetermined voltage to the second node by turning into an ON state.

(15)

The semiconductor circuit according to any one of (1) to (14) described above, further including:

a processing circuit that performs a predetermined process on the basis of a result of latching by the latch circuit.

(16)

The semiconductor circuit according to any one of (1) to (15) described above, wherein the first memory element and the second memory element are each configured to hold information by using a reversible change of a resistance state between a first resistance state and a second resistance state.

(17)

The semiconductor circuit according to (16) described above, in which each of the first memory element and the second memory element includes a magnetic tunnel junction element.

This application claims priority based on Japanese Patent Application No. 2021-188663 filed on Nov. 19, 2021 with Japan Patent Office, the entire contents of which are incorporated in this application by reference.

It should be understood by those skilled in the art that various modifications, combinations, sub-combinations and alterations may occur depending on design requirements and other factors, and they are within the scope of the appended claims or the equivalents thereof.

The invention claimed is:

1. A semiconductor circuit comprising:

a first memory cell including a first memory element;

a first signal line coupled to the first memory cell;

a second memory cell including a second memory element;

a second signal line coupled to the second memory cell;

a sense amplifier including:

a latch circuit configured to apply, to a second node, a voltage inverted with respect to a voltage at a first node, and apply, to the first node, a voltage inverted with respect to a voltage at the second node;

a first transistor including a source, and including a gate and a drain that are coupled to the first node;

a second transistor including a source, and including a gate and a drain that are coupled to the second node; and a third transistor including a source, a gate to which a control voltage is applicable, and a drain coupled to the source of the first transistor, the source of the second transistor, or both;

a first switch configured to couple the first signal line and the first node to each other by turning into an ON state; and a second switch configured to couple the second signal line and the second node to each other by turning into an ON state.

2. The semiconductor circuit according to claim 1, wherein the drain of the third transistor is coupled to the source of the first transistor, and the sense amplifier includes a fourth transistor including:

a source;

a gate to which the control voltage is applied; and a drain coupled to the source of the second transistor.

3. The semiconductor circuit according to claim 2, further comprising:

a control voltage generating circuit configured to generate the control voltage, wherein the first memory element and the second memory element are each configured to hold information by using a reversible change of a resistance state, the reversible change corresponding to a direction of a current flowing between both ends, in a case where an electric current value of the current is larger than a predetermined value, the third transistor is configured to cause a current lower than the predetermined value to flow through the first memory element on a basis of the control voltage, and the fourth transistor is configured to cause a current lower than the predetermined value to flow through the second memory element on the basis of the control voltage.

4. The semiconductor circuit according to claim 2, wherein the drain of the third transistor and the drain of the fourth transistor are coupled to each other.

5. The semiconductor circuit according to claim 2, wherein the third transistor includes a plurality of transistors coupled in parallel to each other, and the fourth transistor includes a plurality of transistors coupled in parallel to each other.

6. The semiconductor circuit according to claim 2, wherein the source of the third transistor and the source of the fourth transistor are coupled to a power supply node.

7. The semiconductor circuit according to claim 2, wherein the sense amplifier includes:

a first power supply switch configured to couple a power supply node and the source of the third transistor to each other by turning into an ON state; and a second power supply switch configured to couple the power supply node and the source of the fourth transistor to each other by turning into an ON state.

8. The semiconductor circuit according to claim 1, wherein the drain of the third transistor is coupled to the source of the first transistor and the source of the second transistor.

9. The semiconductor circuit according to claim 8, further comprising:

a control voltage generating circuit configured to generate a control voltage, wherein the first memory element and the second memory element are each configured to hold information by using a reversible change of a resistance state, the reversible change corresponding to a direction of a current flowing between both ends, in a case where an electric current value of the current is larger than a predetermined value, and the third transistor causes a current lower than the predetermined value to flow through the first memory element and the second memory element on a basis of the control voltage.

10. The semiconductor circuit according to claim 1, wherein the latch circuit includes:

a fifth transistor of a first conductivity type, the fifth transistor including:

a gate coupled to the second node;

a drain coupled to the first node; and a source; and a sixth transistor of the first conductivity type, the sixth transistor including:

a gate coupled to the first node;

a drain coupled to the second node; and a source.

11. The semiconductor circuit according to claim 10, wherein the latch circuit further includes:

a seventh transistor of a second conductivity type, the seventh transistor including:

a gate coupled to the second node;

a drain coupled to the first node; and a source; and an eighth transistor of the second conductivity type, the eighth transistor including:

a gate coupled to the first node;

a drain coupled to the second node; and a source.

12. The semiconductor circuit according to claim 1, further comprising:

a voltage setting section configured to set a voltage at the first node and a voltage at the second node to be equal to each other.

13. The semiconductor circuit according to claim 12, wherein the voltage setting section includes a third switch configured to couple the first node and the second node to each other by turning into an ON state.

14. The semiconductor circuit according to claim 12, wherein the voltage setting section includes:

a fourth switch configured to apply a predetermined voltage to the first node by turning into an ON state; and a fifth switch configured to apply the predetermined voltage to the second node by turning into an ON state.

15. The semiconductor circuit according to claim 1, further comprising:

a processing circuit that performs a predetermined process on a basis of a result of latching by the latch circuit.

16. The semiconductor circuit according to claim 1, wherein the first memory element and the second memory element are each configured to hold information by using a reversible change of a resistance state between a first resistance state and a second resistance state.

17. The semiconductor circuit according to claim 16, wherein each of the first memory element and the second memory element comprises a magnetic tunnel junction element.

* * * * *